(12) United States Patent
Han et al.

(10) Patent No.: US 11,220,748 B2
(45) Date of Patent: Jan. 11, 2022

(54) GAS SUPPLY AND LAYER DEPOSITION APPARATUS INCLUDING THE SAME

(71) Applicant: Samsung Electronics Co., Ltd., Suwon-si (KR)

(72) Inventors: Donghoon Han, Seoul (KR); Seoyoung Maeng, Seoul (KR); Byounghoon Ji, Hwaseong-si (KR); Minjoon Kim, Gwangmyeong-si (KR); Jongyong Bae, Hwaseong-si (KR); Kyuho Lee, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 47 days.

(21) Appl. No.: 16/858,054

(22) Filed: Apr. 24, 2020

(65) Prior Publication Data

US 2021/0062339 A1 Mar. 4, 2021

(30) Foreign Application Priority Data

Sep. 2, 2019 (KR) .......................... 10-2019-0108323

(51) Int. Cl.
*C23C 16/40* (2006.01)
*C23C 16/455* (2006.01)
(Continued)

(52) U.S. Cl.
CPC .... *C23C 16/45544* (2013.01); *C23C 16/4408* (2013.01); *C23C 16/4583* (2013.01);
(Continued)

(58) Field of Classification Search
CPC .......... C23C 16/45544; C23C 16/4408; C23C 16/52; C23C 16/4583; C23C 16/06;
(Continued)

(56) References Cited

U.S. PATENT DOCUMENTS

| 1,123,828 A | 1/1915 | Whitaker et al. |
| 8,728,239 B2 | 5/2014 | Bauer et al. |

(Continued)

FOREIGN PATENT DOCUMENTS

| JP | 5859586 B2 | 2/2016 |
| JP | 2016046503 A | 4/2016 |

(Continued)

*Primary Examiner* — Rudy Zervigon
(74) *Attorney, Agent, or Firm* — Muir Patent Law, PLLC

(57) ABSTRACT

A gas supply for a layer deposition apparatus including a plurality of charge distribution lines connected to a first gas supply source and a plurality of gas filling tanks respectively connected to the charge distribution lines is disclosed. Each of the gas filling tanks may be pressurized with a first gas from the first gas supply source, and a gas supply line connected to a second gas supply source. The apparatus may include a multi-dosing valve assembly connected to outlet portions of the gas filling tanks and configured to supply, sequentially, the first gas from the gas filling tanks to a process chamber. The multi-dosing valve assembly may include a flow path block having a main supply line connected to the process chamber and a backflow prevention valve block fastened to the flow path block and having an opening/closing valve therein.

20 Claims, 19 Drawing Sheets

(51) Int. Cl.
*C23C 16/44* (2006.01)
*C23C 16/52* (2006.01)
*H01L 21/285* (2006.01)
*C23C 16/458* (2006.01)
*H01L 27/11582* (2017.01)

(52) U.S. Cl.
CPC ........ *C23C 16/52* (2013.01); *H01L 21/28568* (2013.01); *H01L 27/11582* (2013.01)

(58) Field of Classification Search
CPC .......... C23C 16/45561; C23C 16/4581; C23C 16/4401; C23C 16/14; C23C 16/18; C23C 16/401; C23C 16/345; C23C 16/45525; H01L 21/28568; H01L 27/11582; H01L 21/76843; H01L 21/76877; H01L 21/28562; H01L 21/76838; H01L 21/76882; H01L 21/67017; H01L 21/0228; B60K 2015/03118; B60K 2015/03157; F02M 37/0088; F02M 37/0094; F17C 2205/0142
USPC ........................ 137/255; 118/715; 156/345.1
See application file for complete search history.

(56) References Cited

U.S. PATENT DOCUMENTS

| | | | |
|---|---|---|---|
| 9,558,969 | B2 | 1/2017 | Seigeot |
| 2004/0173151 | A1* | 9/2004 | Miwa ........................ F17D 1/04 118/715 |
| 2015/0020973 | A1* | 1/2015 | Arami ................ H01L 21/3065 156/345.29 |
| 2015/0064908 | A1 | 3/2015 | Moriya et al. |
| 2015/0170909 | A1 | 6/2015 | Sato |
| 2015/0187611 | A1 | 7/2015 | Sato |
| 2017/0159180 | A1 | 6/2017 | Sawachi et al. |
| 2017/0175269 | A1 | 6/2017 | Chandrasekharan et al. |
| 2017/0362705 | A9 | 12/2017 | Kumar et al. |

FOREIGN PATENT DOCUMENTS

| | | |
|---|---|---|
| KR | 10-1999-0004094 U | 1/1999 |
| KR | 10-1236696 B1 | 2/2013 |
| KR | 10-1366385 B1 | 2/2014 |
| KR | 10-2019-0048412 A | 5/2019 |

* cited by examiner

GAS SUPPLY AND LAYER DEPOSITION APPARATUS INCLUDING THE SAME

PRIORITY STATEMENT

This application claims priority under 35 U.S.C. § 119 to Korean Patent Application No. 10-2019-0108323, filed on Sep. 2, 2019 in the Korean Intellectual Property Office (KIPO), the contents of which are herein incorporated by reference in their entirety.

BACKGROUND

1. Field

Example embodiments relate to a gas supply and a layer deposition apparatus including the same. More particularly, example embodiments relate to a gas supply used for depositing a thin layer in an atomic layer deposition (ALD) process and a layer deposition apparatus including the same.

2. Description of the Related Art

In an atomic layer deposition (ALD) process, a deposition gas such as a source gas, a reaction gas, etc., may be injected into a process chamber using a shower head. As a stacked number of gate electrodes increases according to high degree of integration of a memory device, for example, VNAND, the deposition gas may become decomposed before reaching a bottom surface of an opening having a high aspect ratio, thereby deteriorating step coverage.

SUMMARY

Example embodiments provide a gas supply capable of forming a thin layer having excellent characteristics.

Example embodiments provide a layer deposition apparatus including the gas supply.

According to example embodiments, a gas supply for a layer deposition apparatus may include a plurality of charge distribution lines connected to a first gas supply source, and a plurality of gas filling tanks respectively connected to the charge distribution lines. Each of the gas filling tanks may be pressurized with a first gas from the first gas supply source. The deposition apparatus may further include a gas supply line connected to a second gas supply source and a multi-dosing valve assembly connected to outlet portions of the gas filling tanks that is configured to supply, sequentially, the first gas from the gas filling tanks to a process chamber. The multi-dosing valve assembly may include a flow path block having a main supply line connected to the process chamber, and a plurality of valve blocks fastened to the flow path block, with each valve block having a corresponding discharge valve that is operable to control discharging of the first gas out of the respective gas filling tank to the main supply line. The deposition apparatus may further include a backflow prevention valve block fastened to the flow path block and having an opening/closing valve therein that is operable to control the flow of a second gas from the gas supply line to the main supply line.

According to example embodiments, a layer deposition apparatus may include a process chamber configured to house a substrate and provide a space for performing a deposition process on the substrate, at least one first gas supply source, a second gas supply source, and a gas supply including a plurality of gas filling tanks pressurized with a first gas from the first gas supply source. The deposition apparatus may further include a multi-dosing valve assembly connected to outlet portions of the gas filling tanks and configured to supply, sequentially, the first gas from the gas filling tanks to the process chamber and a controller configured to control an operation of the gas supply. The multi-dosing valve assembly may include a flow path block having a main supply line connected to the process chamber, a plurality of valve blocks fastened to the flow path block, each valve block having a corresponding discharge valve. Each respective discharge valve may be operable to control discharging of the first gas out of the respective gas filling tank to the main supply line. The deposition apparatus may further include a backflow prevention valve block fastened to the flow path block and having an opening/closing valve therein that is operable to control the flow of a second gas from the second gas supply source to the main supply line.

According to example embodiments, a layer deposition apparatus may include, a process chamber configured to house a substrate and provide a space for performing a deposition process on the substrate, a source gas supply configured to supply a source gas from at least one source gas supply source to the process chamber, a reaction gas supply configured to supply a reaction gas from at least one reaction gas supply source to the process chamber, and a purge gas supply configured to supply a purging gas from at least one purge gas supply source to the process chamber. In some embodiments, at least one of: the source gas supply, the reaction gas supply and the purge gas supply includes a plurality of charge distribution lines connected to the source gas supply source, the reaction gas supply source, or the purge gas supply source, a plurality of gas filling tanks respectively connected to the charge distribution lines with each of the gas filling tanks being pressurized with at least one gas chosen from: the source gas, the reaction gas, and the purge gas. The deposition apparatus may further include a plurality of discharge valves connected in sequence to a main supply line which is connected to the process chamber. In example embodiments, each respective discharge valve may be operable to control discharging of a corresponding gas out of the respective gas filling tank to the main supply line. The deposition apparatus may further include a plurality of flow controllers, each flow controller may be respectively installed in a corresponding charge distribution line.

According to example embodiments, a layer deposition apparatus may include a plurality of gas filling tanks charging a first gas supplied from a first gas supply source, and a multi-dosing valve assembly connected to outlet portions of the gas filling tanks and configured to supply sequentially the first gas from the gas filling tanks to a process chamber. The multi-dosing valve assembly may include a plurality of valve blocks fastened to a flow path block and having a plurality of discharge valves operable to control discharging of the first gas out of the respective gas filling tank, and a backflow prevention valve block fastened to the flow path block and having an opening/closing valve operable to control flowing of a second gas from a second gas supply source to the main supply line.

Accordingly, the first gas (source gas, reaction gas or purging gas) from the gas filling tanks may be supplied sequentially in multi stages to a process chamber through the multi-dosing valve assembly, to thereby maximize layer deposition efficiency. The multi-dosing valve assembly may include the opening/closing valve operable to control discharging of the second gas for purging passages within the valve assembly, to thereby prevent contamination of the valve assembly, and, backflow of the first gas may be prevented by the opening/closing valve to thereby minimize pressure drop during the injection of the first gas.

Thus, a large amount of the gas having a relatively high pressure may be supplied sufficiently to a bottom surface of an opening to thereby prevent the gas from being decomposed and/or prematurely decomposing. Therefore, step coverage characteristics of a thin film and UPEH (Unit Per Equipment Hour) may be improved. Further, since the multi-dosing valve assembly may be designed to have various configurations, various process conditions may be obtained without remodeling or changing the configuration of the equipment. Additionally, some embodiments disclosed herein are directed to a method of manufacturing a semiconductor device that implements the exemplary disclosed methods and/or exemplary apparatus.

BRIEF DESCRIPTION OF THE DRAWINGS

Example embodiments will be more clearly understood from the following detailed description taken in conjunction with the accompanying drawings.

FIG. 1 is a block diagram illustrating a layer deposition apparatus in accordance with example embodiments.

FIG. 2 is a block diagram illustrating a source gas supply and a purge gas supply in FIG. 1.

FIG. 3 is a perspective view illustrating a multi-dosing valve assembly connected to a plurality of gas filling tanks of the source gas supply in FIG. 2.

FIG. 4 is a perspective view illustrating the gas filling tank in FIG. 3.

FIGS. 5 and 6 are cross-sectional views illustrating the multi-dosing valve assembly in accordance with example embodiments.

FIG. 7 is a graph illustrating a pressure change of a source gas within the gas filling tank in FIG. 4.

FIG. 8 is a graph illustrating pressure changes within the gas filling tanks in a multi dosing process in accordance with example embodiments.

FIG. 9 is a flow chart illustrating a layer deposition method in accordance with example embodiments.

FIGS. 10 and 11 are flow charts illustrating a gas supply process by opening/closing of discharge valves according to the layer deposition method in FIG. 9.

FIGS. 12 to 16 are cross-sectional views illustrating a method of manufacturing a semiconductor device in accordance with example embodiments.

FIGS. 17 to 23 are cross-sectional views illustrating a method of manufacturing a semiconductor device in accordance with example embodiments.

DETAILED DESCRIPTION OF EXAMPLE EMBODIMENTS

Hereinafter, example embodiments will be explained in detail with reference to the accompanying drawings.

Figure 1:
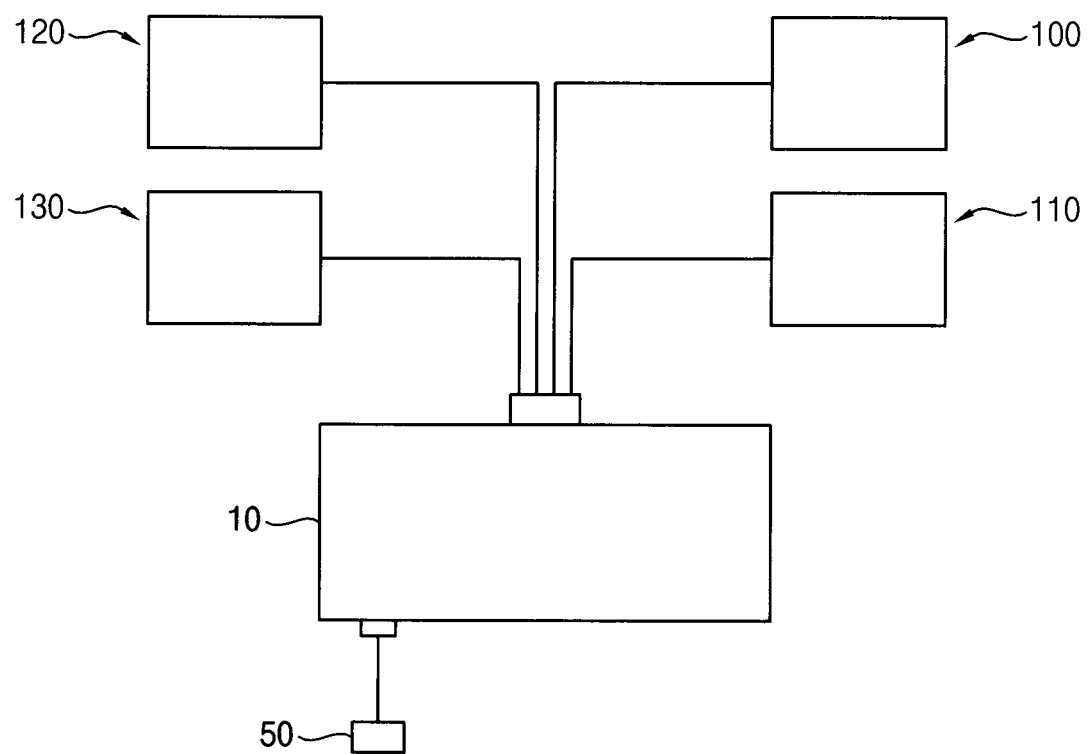
FIGS. 1 to 23 represent non-limiting, example embodiments as described herein.
Figure 2:
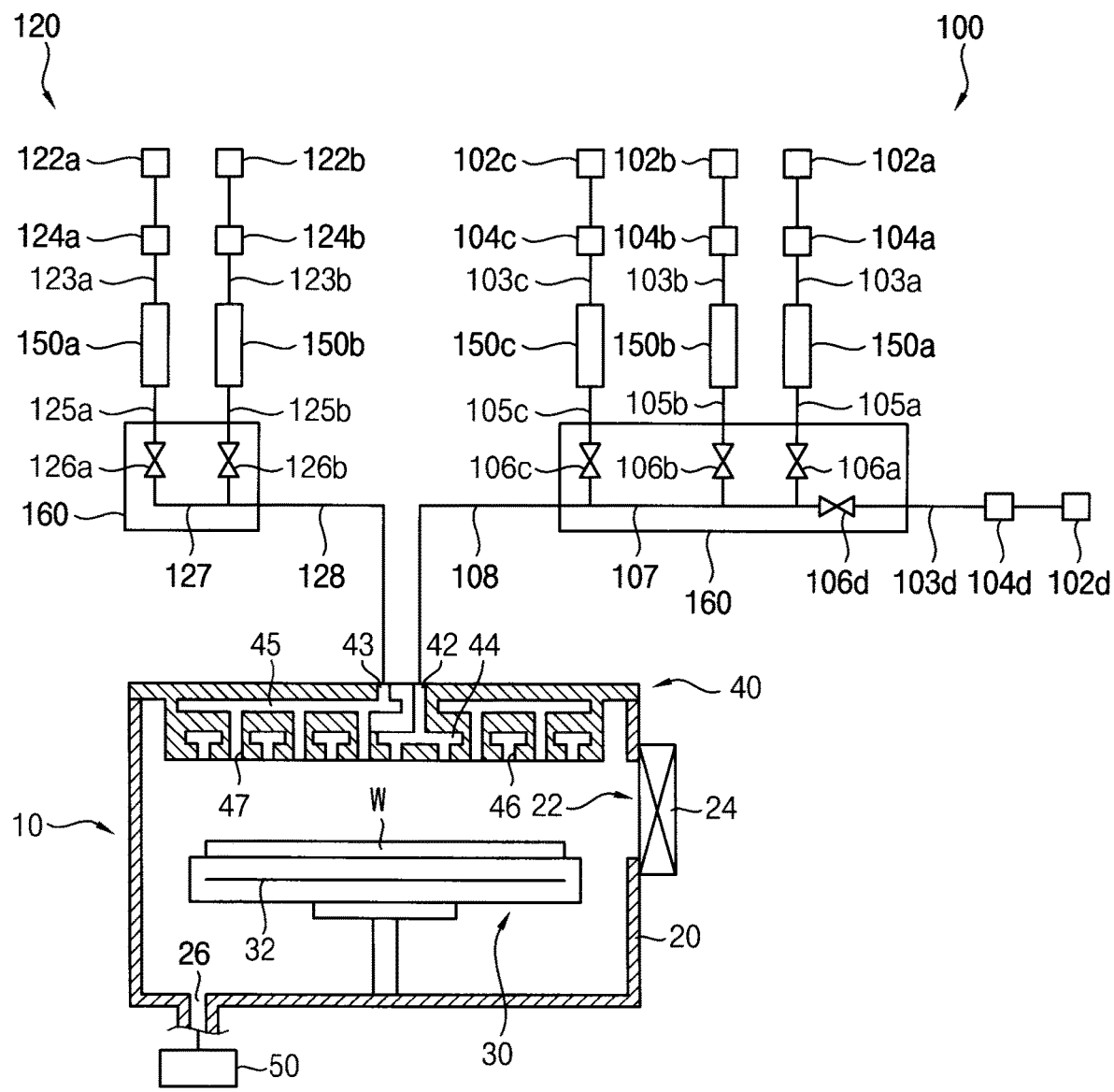
Figure 3:
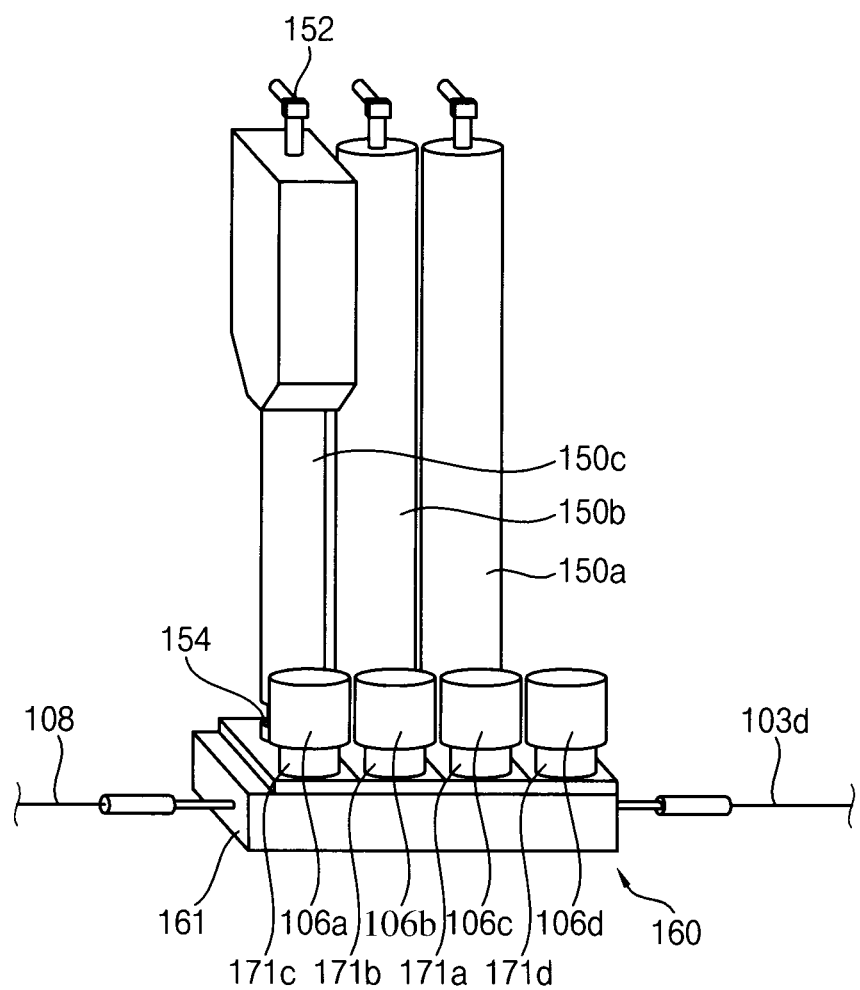
Figure 4:
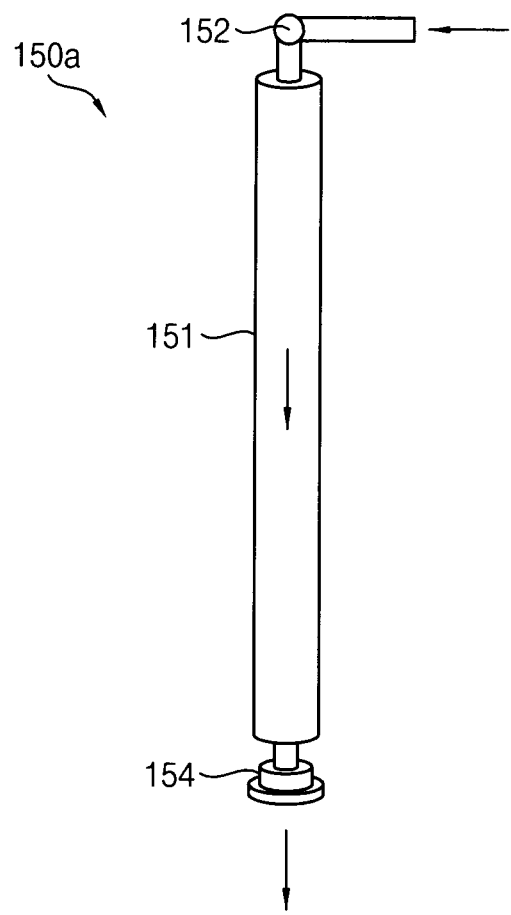
Figure 5:
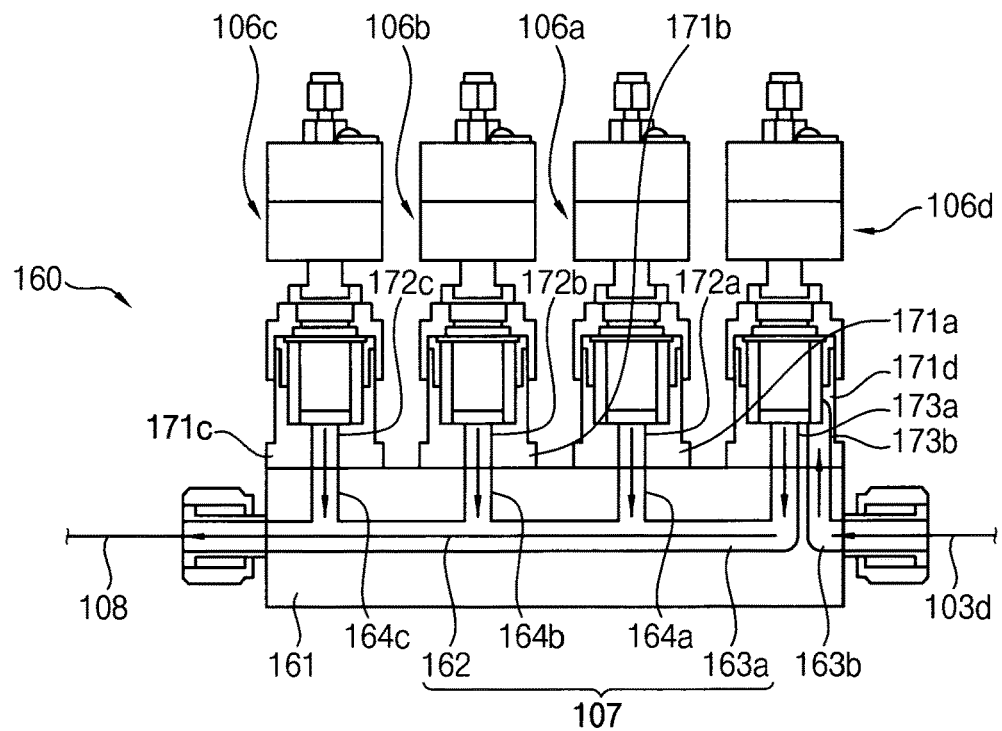
Figure 6:
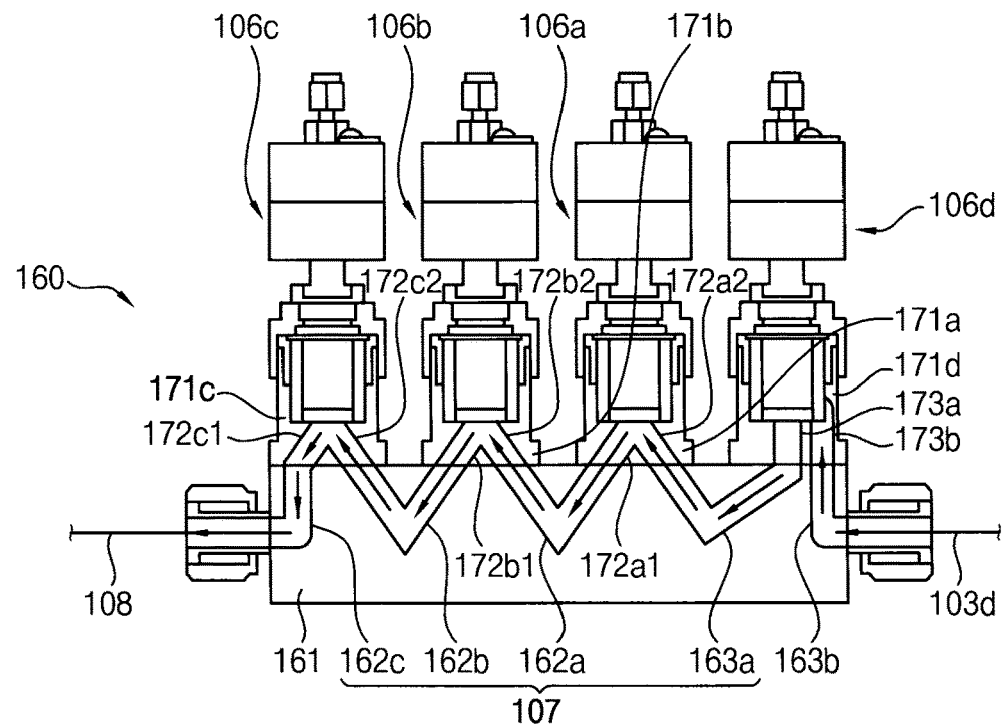
Figure 7:
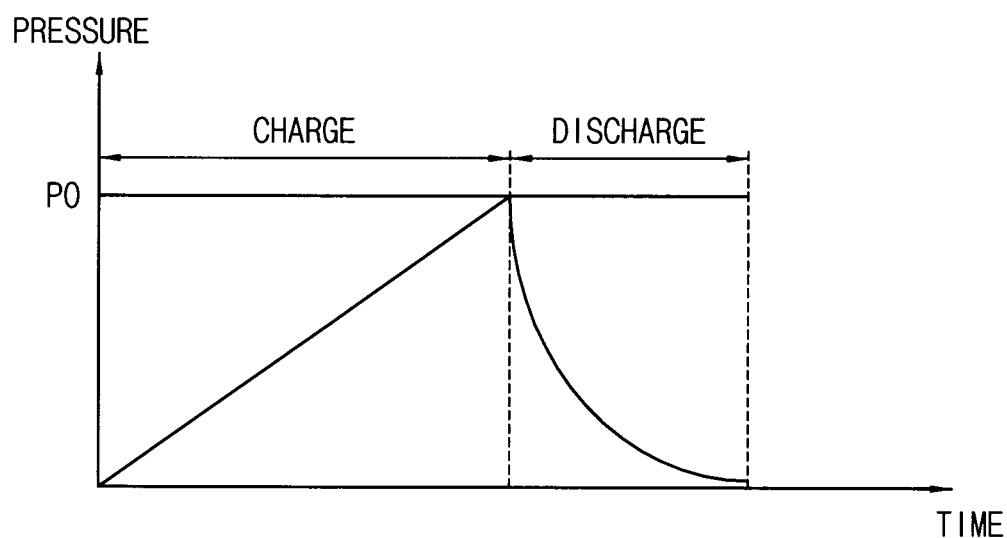
Figure 8:
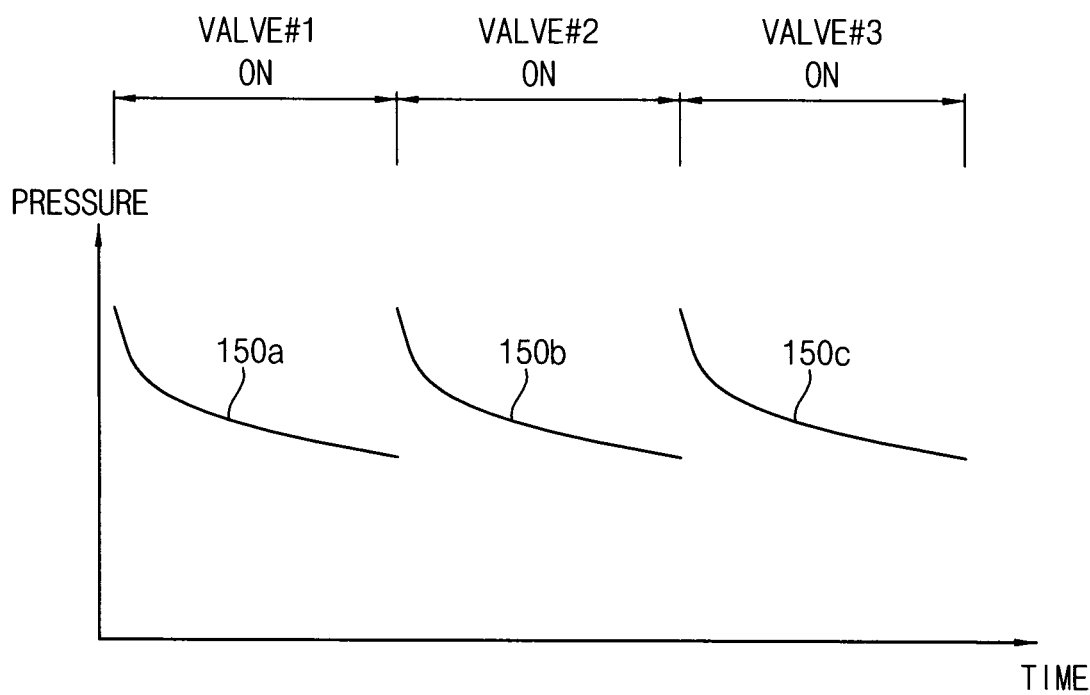

FIG. 1 is a block diagram illustrating a layer deposition apparatus in accordance with example embodiments. FIG. 2 is a block diagram illustrating a source gas supply and a purge gas supply in FIG. 1. FIG. 3 is a perspective view illustrating a multi-dosing valve assembly connected to a plurality of gas filling tanks of the source gas supply in FIG. 2. FIG. 4 is a perspective view illustrating the gas filling tank in FIG. 3. FIGS. 5 and 6 are cross-sectional views illustrating the multi-dosing valve assembly in accordance with example embodiments. FIG. 7 is a graph illustrating a pressure change of a source gas within the gas filling tank in FIG. 4. FIG. 8 is graph illustrating pressure changes within the gas filling tanks in a multi dosing process in accordance with example embodiments.

Referring to FIGS. 1 to 8, a layer deposition apparatus may include a process chamber 10, a source gas supply 100, a reaction gas supply 110 and a purge gas supply. The purge gas supply may include a first purge gas supply 120 and a second purge gas supply 130.

In example embodiments, the process chamber 10 may receive a substrate W and may provide a space for performing a deposition process. The process chamber 10 may be used for an atomic layer deposition (ALD) process, for example.

The substrate W may be an object on which a tungsten-containing thin film is formed. For example, the substrate W may be formed from a semiconductor wafer such as a silicon wafer or a germanium wafer. Various structures (not illustrated) may be further formed on the substrate W.

For example, a conductive layer or an electrode including a metal, a metal nitride, a metal silicide, a metal oxide or the like, or an insulation layer including silicon oxide or silicon nitride may be further formed on the substrate W. In some embodiments, an insulation layer including a hole or an opening therein may be formed on the substrate W, and the tungsten-containing thin film may be vapor-deposited in the hole or the opening through subsequent processes.

The process chamber 10 may include a substrate support 30 within a chamber 20 as a susceptor on which the substrate W is loaded. One or more substrates W may be disposed on the substrate support 30. The substrate support 30 may be installed to be movable upwardly and downwardly. Additionally, the substrate support 30 may be installed to be rotatable.

The substrate support 30 may include a heater 32. The heater 32 may be connected to a heater power supply (not illustrated) and may heat the substrate W to a desired temperature.

A gate 22 for loading/unloading the substrate W may be provided in a sidewall of the chamber 20, and a gate valve 24 for opening/closing the gate 22 may be installed. Additionally, a heater (not illustrated) may be installed on the sidewall of the chamber 20, to control the temperature of the chamber 20 during the layer deposition process. For example, the chamber 20 may be maintained at a temperature ranging from about 200° C. to about 600° C.

An exhaust port 26 may be provided in a bottom wall of the chamber 20. An exhaust device 50 including a vacuum pump, a pressure control valve, etc may be connected to the exhaust port 26 via an exhaust pipe. An interior of the chamber 20 may be maintained in a predetermined depressurized state by operation of the exhaust device 50.

A shower head 40 may be provided in a top wall of the chamber 20. The shower head 40 may be installed in an open upper end of the chamber 20. The shower head 40 may include an upper space 44 and a lower space 45. A first gas introduction channel 42 may be connected to the lower space 44, and first gas injection channels 46 may extend from the lower space 44 to a bottom surface of the shower head 40. A second gas introduction channel 43 may be connected to the upper space 45, and second gas injection channels 47 may extend from the upper space 45 to the bottom surface of the shower head 40.

The shower head 40 may be configured to supply a source gas and a reaction gas as a film formation source gas into the chamber 20 through the first and second gas injection channels 46, 47.

In example embodiments, the source gas supply 100 may include a plurality of gas filling tanks 150a, 150b, 150c charging the source gas supplied from source gas supply sources 102a, 102b, 102c to a predetermined charge pressure, respectively, and may supply the source gas simultaneously or sequentially discharged from the gas filling tanks 150a, 150b, 150c to the process chamber 10.

The source gas supply source may include a bubbler and may vaporize a metallic precursor and supply to the process chamber 10. Examples of the source gas may be $WF_6$, $WCl_6$, $WBr_6$, $W(Co)_6$, $W(C_2H_2)_6$, $W(PF_3)_6$, $(C_2H_5)WH_2$, etc.

As illustrated in FIG. 2, the source gas supply 100 may include first to third charge distribution lines 103a, 103b, 103c respectively connected to the first to third source gas supply sources 102a, 102b, 102c, the first to third gas filling tanks 150a, 150b, 150c respectively connected to the first to third charge distribution lines 103a, 103b, 103c, first to third discharge distribution lines 105a, 105b, 105c respectively connected to the first to third gas filling tanks 150a, 150b, 150c, and a main supply line 107 with which the first to third discharge distribution lines 105a, 105b, 105c are connected in parallel. A first end portion of the main supply line 107 may be connected to a source gas supply line 108, and the source gas supply line 108 may be connected to the process chamber 10. The source gas supply line 108 may be connected to the first gas introduction channel 42 of the shower head 40.

The source gas supply 100 may include first to third discharge valves 106a, 106b, 106c respectively installed in the first to third discharge distribution lines 105a, 105b, 105c to control flowing of the source gas out of the first to third gas filling tanks 150a, 150b, 150c.

Additionally, the source gas supply 100 may include first to third flow controllers 104a, 104b, 104c respectively installed in the first to third charge distribution lines 103a, 103b, 103c to control a flow rate of the source gas supplied to the first to third gas filling tanks 150a, 150b, 150c. For example, the first to third flow controllers may include a mass flow controller (MFC).

Although it is not illustrated in the figures, the source gas supply may include first to third charge valves respectively installed in the first to third charge distribution lines 103a, 103b, 103c to control flowing of the source gas to the first to third gas filling tanks 150a, 150b, 150c.

In example embodiments, the source gas supply 100 may include a carrier gas supply line 103d connected to a carrier gas supply source 102d. The carrier gas supply line 103d may be connected to a second end portion of the main supply line 107 opposite to the first end portion. The source gas supply 100 may include a carrier gas opening/closing valve 106d which is installed in the carrier gas supply line 103d to control flowing of a carrier gas to the main supply line 107. As described later, the carrier gas opening/closing valve 106d may serve as a backflow prevention opening/closing valve for preventing backflow of the source gas in the main supply line 107.

Additionally, the source gas supply 100 may include a fourth flow controller 104d installed in the carrier gas supply line 103d to control a flow rate of the carrier gas supplied to the main supply line 107. The carrier gas may include a gas that is of a same type as the purging gas (as will be additionally described later).

The layer deposition apparatus may further include a controller (not illustrated) for controlling charging and pressurizing the source gas and supplying the carrier gas of the source gas supply 100. The controller may control opening and closing of the first to third charge valves, the first to third discharge valves 106a, 106b, 106c and the carrier gas supply opening/closing valve 106d. Additionally, the controller may control the flow rates of the source gas and the carrier gas using the first to fourth flow controllers 104a, 104b, 104c, 104d. The term "controller" is meant to be used in its broadest sense to include one or more controllers, computers and/or microprocessors, and/or other computer hardware, and/or software, and/or computer implemented algorithms that may be associated with the first to third discharge valves 106a, 106b, 106c, opening/closing valve 106d, and first to fourth flow controllers 104a, 104b, 104c, 104d, for example. Furthermore, the controller may control the opening and closing of various electrically operated valves, actuators, solenoids, or the like.

Hereinafter, the first to third gas filling tanks and a multi-dosing valve assembly connected to the first to third gas filling tanks will be explained.

First, the first gas filling tank will be explained. Because the second and third gas filling tanks are substantially the same as the first gas filling tank, any repetitive explanation concerning the second and third gas filling tanks will be omitted.

As illustrated in FIG. 4, the first gas filling tank 150a may include a charge chamber 151, and an inlet portion 152 and an outlet portion 154 respectively connected to both end portions of the charge chamber 151. For example, the charge chamber 151 may be a tube type structure. The source gas may be introduced into the charge chamber 151 through the inlet portion 152 and charged within the charge chamber 151, and then, the gas charged within the charge chamber 151 may be discharged through the outlet portion 154.

As illustrated in FIG. 7, in a charge step of the first gas filling tank 150a, the first charge valve may be opened and the first discharge valve 106a may be closed. Thus, the charge chamber may be filled with the source gas from the first source gas supply source 102a to have a predetermined charge pressure $P_0$, that is, an upper limit charge pressure. The charge pressure $P_0$ within the charge chamber may be a pressure to which the charge chamber ultimately equilibrates for an exposure time to the flow of the source gas from the first source gas supply source 102a.

In a discharge step of the first gas filling tank 150a, the first charge valve may be closed and the first discharge valve 106a may be opened. Thus, the source gas may be discharged from the charge chamber to the main supply line 107, so that the pressure in the charge chamber may be reduced.

Hereinafter, the multi-dosing valve assembly will be explained.

As illustrated in FIG. 3, the source gas supply 100 may include the multi-dosing valve assembly 160 configured to supply sequentially the source gas from the first to third gas filling tanks 150a, 150b, 150c to the process chamber 10.

In particular, the multi-dosing valve assembly 160 may include a flow path block 161 having the main supply line 107, and first to third valve blocks 171a, 171b, 171c fastened to the flow path block 161 and respectively having the first to third discharge valves 106a, 106b, 106c to control discharging of the source gas out of the first to third gas filling tanks 150a, 150b, 150c to the main supply line 107. For example, the flow path block 161 may be any type of housing having a flow path therein that may be connected to the main supply line 107 and/or first to third discharge valves 106a, 106b, 106c. Additionally, the flow path block may structurally support and arrange first to third discharge valves 106a, 106b, 106c. The first to third discharge valves 106a, 106b, 106c may be connected in sequence and arranged in parallel with the main supply line 107. For example, the first discharge valve 106a may be connected to first source gas supply 102a, the second discharge valve 106b may be connected to second source gas supply 102b, and the third discharge valve 106c may be connected to third source gas supply. Additionally, the first to third discharge valves 106a, 106b, 106c may sequentially discharge the source gas from the first to third gas filling tanks 150a, 150b, 150c to the main supply line 107 one at a time. In some embodiments, the first to third discharge valves 106a, 106b, 106c may sequentially discharge the source gas from the first to third gas filling tanks 150a, 150b, 150c to the main supply line 107 but with some discharge operations overlapping, at least partially. Furthermore, the first to third discharge valves 106a, 106b, 106c may be arranged in a direction that is parallel with a direction of flow of the main supply line.

The first to third gas filling tanks 150a, 150b, 150c may be installed along a first side portion of an upper surface of the flow path block 161. The first to third valve blocks 171a, 171b, 171c may be fastened along a second side portion of the upper surface of the flow path block 161 opposite to the first side portion. The outlet portions 154 of the first to third gas filling tanks 150a, 150b, 150c may be connected to inlet passages of the flow path block 161 serving as the first to third discharge distribution lines 105a, 105b, 105c respectively. The inlet passages may be connected to inlet ports of the first to third discharge valves 106a, 106b, 106c respectively. Outlet ports of the first to third discharge valves 106a, 106b, 106c may be connected to outlet passages of the first to third valve blocks 171a, 171b, 171c respectively. The outlet passages may be connected to the main supply line 107 of the flow path block 161.

In example embodiments, the multi-dosing valve assembly 160 may include a fourth valve block 171d having the carrier gas opening/closing valve 106d for controlling flowing of the carrier gas from the carrier gas supply source 102d to the main supply line 107. The carrier gas opening/closing valve 106d may be connected in series to an upstream-side end portion of the main supply line 107.

The fourth valve block may be fastened to the second side portion of the upper surface of the flow path block 161 adjacent to the first valve block. The carrier gas supply line 103d may be connected to an inlet passage of the fourth valve block through a second purge passage of the flow path block 161. The inlet passage may be connected to an inlet portion of the carrier gas opening/closing valve 106d. An outlet port of the carrier gas opening/closing valve 106d may be connected to an outlet passage of the fourth valve block 171d. The outlet passage may be connected to the main supply line 107.

When the first discharge valve 106a is opened (ON), the source gas charged within the first gas filling tank 150a may be introduced into the main supply line 107 and then supplied to the process chamber 10 through the source gas supply line 108. On the other hand, when the first discharge valve 106a is closed (OFF), the source gas from the first source gas supply source 102a may be charged within the first gas filling tank 150a.

When the second discharge valve 106b is opened (ON), the source gas charged within the second gas filling tank 150b may be introduced into the main supply line 107 and then supplied to the process chamber 10 through the source gas supply line 108. On the other hand, when the second discharge valve 106b is closed (OFF), the source gas from the second source gas supply source 102b may be charged within the second gas filling tank 150b.

When the third discharge valve 106c is opened (ON), the source gas charged within the third gas filling tank 150c may be introduced into the main supply line 107 and then supplied to the process chamber 10 through the source gas supply line 108. On the other hand, when the third discharge valve 106c is closed (OFF), the source gas from the third source gas supply source 102c may be charged within the third gas filling tank 150c.

In example embodiments, the multi-dosing valve assembly 160 may include the fourth valve block fastened to the flow path block 161 and having the carrier gas opening/closing valve 106d which is connected to the upstream-side of the main supply line 107 to control discharging of the carrier gas from the carrier gas supply source 102d to the main supply line 107. The carrier gas opening/closing valve 106d may be connected in series to an upstream-side second end portion of the main supply line 107.

When the carrier gas opening/closing valve 106d is opened (ON), the carrier gas from the carrier gas supply source 102d may be introduced into the main supply line 107 and then supplied to the process chamber 10 through the source gas supply line 108. When the carrier gas opening/closing valve 106 is closed (OFF), supplying of the carrier gas from the carrier gas supply source 102 to the main supply line 107 may be stopped.

On the other hand, when at least one of the first to third discharge valves 106a, 106b, 106c is opened, the carrier gas opening/closing valve 106d may be closed to prevent backflow of the source gas discharged from the first to third gas filling tanks 150a, 150b, 150c to the upstream-side end portion of the main supply line 107.

For example, the first to third discharge valves 106a, 106b, 106c and the carrier gas opening/closing valve 106d may include a solenoid valve.

As illustrated in FIG. 8, as the first to third discharge valves 106a, 106b, 106c of the multi-dosing valve assembly 160 are opened and closed in sequential order, the source gas may be supplied sequentially from the first to third gas filling tanks 150a, 150b, 150c to the process chamber.

The source gas from the second gas filling tank 150b may be injected into the process chamber during or at the end of the injection of the source gas from the first gas filling tank 150a. Similarly, the source gas from the third gas filling tank 150c may be injected into the process chamber during or at the end of the injection of the source gas from the second gas filling tank 150b. The carrier gas from the carrier gas supply source may be injected into the process chamber during or at the end of the injection of the source gas form the third gas filling tank 150c.

Additionally, when the source gas from the second gas filling tank 150b is injected after the completion of the injection of the source gas from the first gas filling tank 150a, the first gas filling tank 150a may be filled with the source gas from the first source gas supply source 102a. When the source gas from the third gas filling tank 150c is injected after the completion of the injection of the source gas from the second gas filling tank 150b, the second gas filling tank 150b may be filled with the source gas from the second source gas supply source 102b. When the carrier gas from the carrier gas supply source 102d is injected after the completion of the injection of the source gas from the third gas filling tank 150c, the third gas filling tank 150c may be filled with the source gas from the third source gas supply source 102c.

In example embodiments, after the source gas is supplied sequentially from the first to third gas filling tanks 150a, 150b, 150c, the carrier gas from the carrier gas supply source 102d may be introduced into the main supply line 107 and then supplied to the process chamber 10 through the source gas supply line 108. The carrier gas may flow from the second end to the first end portion of the main supply line 107, to thereby exhaust the source gas and particles remaining in the main supply line 107.

Since the first to third gas filling tanks 106a, 106b, 106c are charged with a high pressure, when the first to third discharge valves 106a, 106b, 106c are opened, the source gas may be exhausted through a downstream-side end portion of a main fluid passage 162 or may flow backward upstream of the main fluid passage 162. As the backflow occurs, it may be difficult to control a supply amount per hour (a rate of supply) and pollution in the path may be caused by the backflow.

Hereinafter, various multi-dosing block bodies will be explained.

Referring to FIG. 5, a high capacity type multi-dosing valve assembly 160 is illustrated. A first main flow passage 162, a first purge flow passage 163a and a second purge flow passage 163b may be formed in the flow path block 161. The first main flow passage 162 and the first purge flow passage 163a may be provided as the main supply line 107. The first purge passage 163a may be connected to an upstream-side end portion of the first main flow passage 162. The first purge passage 163a may constitute at least a portion of the upstream-side end portion of the main supply line 107. First to third distribution passages 164a, 164b, 164c may be connected sequentially to the first main flow passage 162. The second purge flow passage 163b may be connected to the carrier gas supply line 103d. A downstream-side end portion of the first main flow passage 162 may be connected to the source gas supply line 108.

First to third outlet passages 172a, 172b, 172c may be formed in the first to third valve blocks 171a, 171b, 171c to be connected to the outlet ports of the first to third discharge valves 106a, 106b, 106c respectively. The first to third outlet passages 172a, 172b, 172c may be connected to the first to third distribution passages 164a, 164b, 164c of the flow path block 161 respectively.

An inlet passage 173b may be formed in the fourth valve block 171d to be connected to the inlet port of the carrier gas opening/closing valve 106d, and an outlet passage 173a may be formed in the fourth valve block 171d to be connected to the outlet port of the carrier gas opening/closing valve 106d. The outlet passage 173a may be connected to the first purge flow passage 163a, and the inlet passage 173b may be connected to the second purge flow passage 163b. Accordingly, the carrier gas opening/closing valve 106d may be installed between the first purge flow passage 163a and the second purge flow passage 163b.

The first to third discharge valves 106a, 106b, 106c may be connected sequentially and in parallel with the first main flow passage 162. Accordingly, the high capacity type multi-dosing valve assembly may open several discharge valves at the same time to supply a greater amount of the gas.

Referring to FIG. 6, a purge type multi-dosing valve assembly 160 is illustrated. First to third supply flow passages 162a, 162b, 162c, a first purge flow passage 163a and a second purge flow passage 163b may be formed in the flow path block 161. The first to third supply flow passages 162a, 162b, 162c and the first purge flow passage 163a may be provided as the main supply line 107. The second purge flow passage 163b may be connected to the carrier gas supply line 103d. A downstream-side end portion of the third supply flow passage 162c may be connected to the source gas supply line 108.

Two first and second outlet passages 172a1, 172a2 may be formed in the first valve block 171a to be connected to the outlet port of the first discharge valve 106a. Two third and fourth outlet passages 172b1, 172b2 may be formed in the second valve block 171b to be connected to the outlet port of the second discharge valve 106b. Two fifth and sixth outlet passages 172c1, 172c2 may be formed in the third valve block 171c to be connected to the outlet port of the third discharge valve 106c. The first outlet passage 172a1 may be connected to an upstream-side end portion of the first supply flow passage 162a, and the second outlet passage 172a2 may be connected to a downstream-side end portion of the first purge flow passage 163a. The third outlet passage 172b1 may be connected to an upstream-side end portion of the second supply flow passage 162b, and the fourth outlet passage 172b2 may be connected to a downstream-side end portion of the first supply flow passage 162a. The fifth outlet passage 172c1 may be connected to an upstream-side end portion of the third supply flow passage 162c, and the sixth outlet passage 172c2 may be connected to a downstream-side end portion of the second supply flow passage 162b.

An inlet passage 173b may be formed in the fourth valve block 171d to be connected to the inlet port of the carrier gas opening/closing valve 106d, and an outlet passage 173a may be formed in the fourth valve block 171d to be connected to the outlet port of the carrier gas opening/closing valve 106d. The outlet passage 173a may be connected to the first purge flow passage 163a, and the inlet passage 173b may be connected to the second purge flow passage 163b.

The flow passages 162a, 162b, 162c, 163a of the flow path block 161 may be connected to the passages 172a1, 172a2, 172b1, 172b2, 172c1, 172c2 of the first to third valve blocks 171a, 17b, 171c. Accordingly, the carrier gas may flow through all passages of the flow path block as well as the valve blocks, to thereby prevent congestion of the source gases and exhaust particles from within the passages.

The reaction gas supply 110 may include a configuration substantially the same as or similar to the source gas supply as described above. For example, the reaction gas supply may include a configuration such as a gas filling tank similarly to the above-mentioned source gas supply. The reaction gas supply 110 may include two gas filling tanks and two discharge valves corresponding to the gas filling tanks. However, the total number of gas filling tanks and discharge valves may be determined in consideration of layer deposition efficiency.

In example embodiments, the reaction gas supply 110 may supply a reaction gas from a reaction gas supply source to the process chamber 10. The reaction gas supply source may include a bubbler and may vaporize a metallic precursor and supply to the process chamber 10. Examples of the reaction gas may be $B_2H_6$, $Si_2H_6$, $SiH_4$, $H_2$, etc.

In example embodiments, the source gas may include a tungsten precursor, and the reaction gas may include boron. The reaction gas may include high concentration $B_2H_6$ gas. The high concentration $B_2H_6$ gas may include $B_2H_6$ of at least 10 wt % based on a total weight. For example, the high concentration $B_2H_6$ gas may include $B_2H_6$ of 10 wt % and a remainder of $H_2$.

The purge gas supply 120, 130 may include a configuration substantially the same as or similar to the source gas supply as described above. The purge gas supply 120, 130 may include two gas filling tanks and two corresponding discharge valves. However, the total number of gas filling tanks and discharge valves may be determined in consideration of layer deposition efficiency. Additionally, although two purge gas supplies 120, 130 are illustrated in the figures, it may not be limited thereto, for example, one purge gas supply or three or more purge gas supplies may be provided.

In example embodiments, the purge gas supply 120, 130 may supply a purging gas from a purge gas supply source to the process chamber 10. For example, the purging gas may include a nitrogen ($N_2$) gas, an argon (Ar) gas, etc.

In particular, as illustrated in FIG. 2, the purge gas supply 120 may include first and second charge distribution lines 123a, 123b respectively connected to first and second purge gas supply sources 122a, 122b, first and second gas filling tanks 150a, 150b respectively connected to the first and second charge distribution lines 123a, 123b, first and second discharge distribution lines 125a, 125 respectively connected to the first and second gas filling tanks 150a, 150b, and a main supply line 127 with which the first and second discharge distribution lines 125a, 125b are connected in parallel. A first end portion of the main supply line 127 may be connected to a purge gas supply line 128, and the purge gas supply line 128 may be connected to the process chamber 10. The purge gas supply line 128 may be connected to the second gas introduction channel 43 of the shower head 40.

The purge gas supply 120 may include first and second discharge valves 126a, 126b respectively installed in the first and second discharge distribution lines 125a, 125b to control flowing of the purging gas out of the first and second gas filling tanks 150a, 150b.

Additionally, the purge gas supply 120 may include first and second flow controllers 124a, 124b respectively installed in the first and second charge distribution lines 123a, 123b to control a flow rate of the purging gas supplied to the first and second gas filling tanks 150a, 150b. For example, the first and second flow controllers may include a mass flow controller (MFC).

Although it is not illustrated in the figures, the purge gas supply may further include first and second charge valves respectively installed in the first and second charge distribution lines 123a, 123b to control flowing of the purging gas to the first and second gas filling tanks 150a, 150b.

Hereinafter, a method of depositing a layer using the layer deposition apparatus in FIGS. 1 and 2 may be explained.

Figure 9:
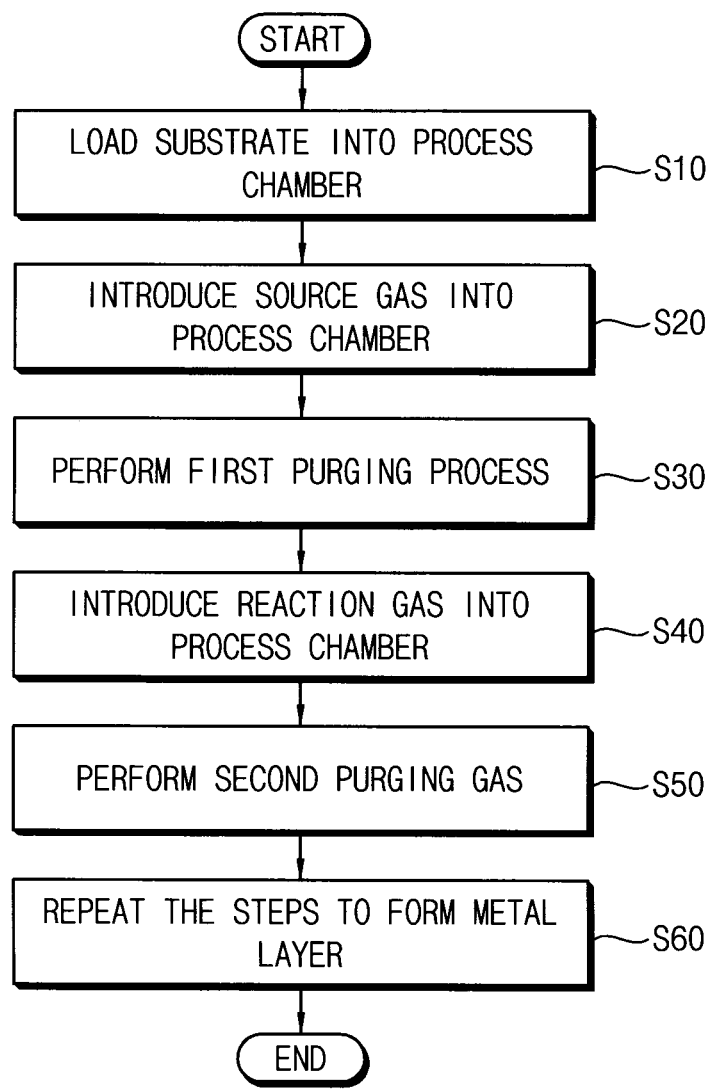
Figure 10:
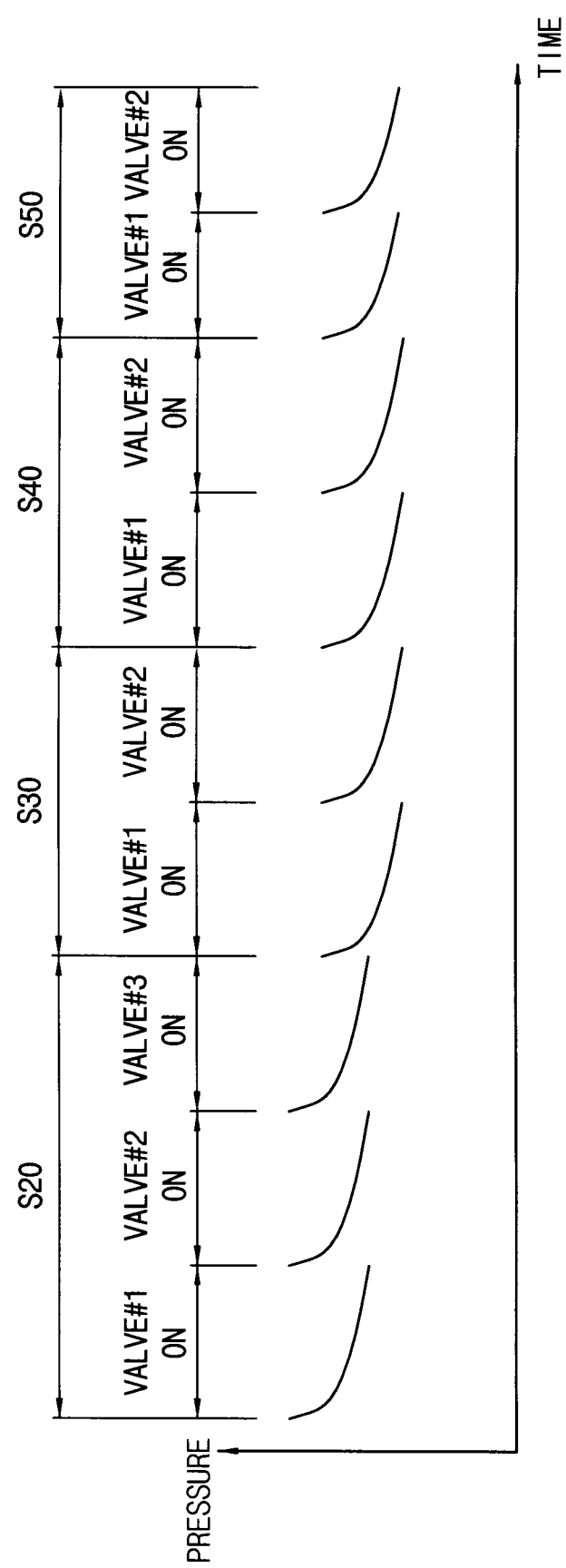
Figure 11:
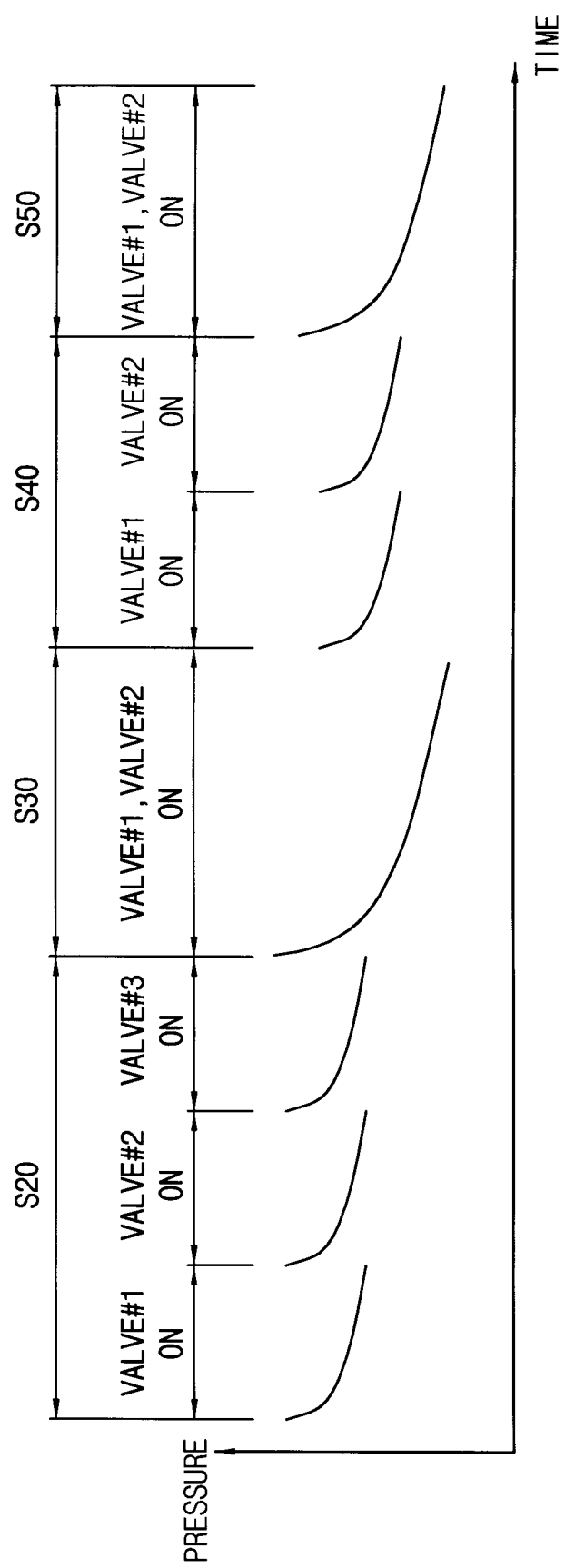

FIG. 9 is a flow chart illustrating a layer deposition method in accordance with example embodiments. FIGS. 10 and 11 are flow charts illustrating a gas supply process by opening/closing of the discharge valves according to the layer deposition method in FIG. 9. The layer deposition method may be applied for forming a tungsten layer on a wafer by an atomic layer deposition process, however, it may not be limited thereto.

Referring to FIGS. 1 to 3, 9, 10 and 11, first, a substrate W may be loaded into a process chamber 10 (S10).

In example embodiments, the process chamber 10 may be used for an ALD process. The substrate W may be an object on which a tungsten-containing thin film is formed. For example, the substrate W may be formed from a semiconductor wafer such as a silicon wafer or a germanium wafer. Various structures (not illustrated) may be further formed on the substrate W.

Then, a source gas may be introduced into the process chamber 10 to form a precursor thin film on the substrate W (S20).

For example, a source gas supply 100 may vaporize a metallic precursor and supply the source gas to the process chamber 10. Examples of the source gas may be $WF_6$, $WCl_6$, $WBr_6$, $W(Co)_6$, $W(C_2H_2)_6$, $W(PF_3)_6$, $(C_2H_5)WH_2$, etc.

In the step of S20, the first to third gas filling tanks 150a, 150b, 150c may be charged with the source gas, and then, the source gas charged within the first to third gas filling tanks 150a, 150b, 150c may be introduced sequentially into the process chamber 10.

As illustrated in FIGS. 10 and 11, the first to third discharge valves 106a, 106b, 106c may be opened and closed in sequential order such that the source gas may be supplied in multi stages from the first to third gas filling tanks 150a, 150b, 150c to the process chamber.

The source gas from the second gas filling tank 150b may be injected into the process chamber during or at the end of the injection of the source gas from the first gas filling tank 150a. Similarly, the source gas from the third gas filling tank 150c may be injected into the process chamber during or at the end of the injection of the source gas from the second gas filling tank 150b. The carrier gas from the carrier gas supply source 102d may be injected into the process chamber during or at the end of the injection of the source gas form the third gas filling tank 150c. For example, the carrier gas may include an argon (Ar) gas.

Additionally, when the source gas from the second gas filling tank 150b is injected after the completion of the injection of the source gas from the first gas filling tank 150a, the first gas filling tank 150a may be filled with the source gas from the first source gas supply source 102a. When the source gas from the third gas filling tank 150c is injected after the completion of the injection of the source gas from the second gas filling tank 150b, the second gas filling tank 150b may be filled with the source gas from the second source gas supply source 102b. When the carrier gas from the carrier gas supply source 102d is injected after the completion of the injection of the source gas from the third gas filling tank 150c, the third gas filling tank 150c may be filled with the source gas from the third source gas supply source 102c.

Then, a first purging process may be performed (S30).

The purge gas supply 120, 130 may supply a first purging gas into the process chamber 10 to remove metallic precursors which may physically adhere to or may not physically adhere to a surface of the substrate W, from the process chamber 10. For example, the first purging gas used in the purging process may include an Ar gas that removes metallic precursors from the process chamber 10.

As illustrated in FIG. 10, the first and second discharge valves 126a, 126b (valve #1, valve #2) may be opened and closed in sequential order such that the purging gas may be supplied in multi stages from the first and second gas filling tanks 150a, 150b to the process chamber 10.

The purging gas from the second gas filling tank 150b may be injected into the process chamber during or at the end of the injection of the purging gas from the first gas filling tank 150a. When the purging gas from the second gas filling tank 150b is injected after the completion of the injection of the purging gas from the first gas filling tank 150a, the first gas filling tank 150a may be filled with the purging gas from the first purge gas supply source 122a.

As illustrated in FIG. 11, the first and second discharge valves 126a, 126b (valve #1, valve #2) may be opened and closed at the same time such that the purging gas may be supplied together from the first and second gas filling tanks 150a, 150b to the process chamber 10. A pressure of the purging gas supplied through the purge gas supply line 127 may be greater than a charge pressure $P_0$ within one gas filling tank.

In example embodiments, when the purging gas is injected into the process chamber 10, the carrier gas from the carrier gas supply source may be injected into the process chamber.

Then, a reaction gas may be introduced into the process chamber 10 to change the precursor thin film into a metal layer (S40).

For example, the reaction gas supply 110 may supply the reaction gas as a reducing gas to the process chamber 10. Examples of the reaction gas may be $B_2H_6$, $Si_2H_6$, $SiH_4$, $H_2$, etc. The reaction gas may include high concentration $B_2H_6$ gas. The high concentration $B_2H_6$ gas may include $B_2H_6$ of at least 10 wt % based on a total weight. For example, the high concentration $B_2H_6$ gas may include $B_2H_6$ of 10 wt % and a remainder of $H_2$.

In the step of S40, the first and second gas filling tanks may be charged with the reaction gas, and then, the reaction gas charged within the first and second gas filling tanks may be introduced sequentially into the process chamber 10.

As illustrated in FIGS. 10 and 11, the first and second discharge valves (valve #1, valve #2) may be opened and closed in sequential order such that the reaction gas may be supplied in multi stages from the first and second gas filling tanks to the process chamber 10.

The reaction gas from the second gas filling tank may be injected into the process chamber during or at the end of the injection of the reaction gas from the first gas filling tank. When the reaction gas from the second gas filling tank is injected after the completion of the injection of the reaction gas from the first gas filling tank, the first gas filling tank may be filled with the reaction gas from the reaction gas supply source.

In conventional systems, the reducing gas such as $B_2H_6$ may decompose before the reducing gas reaches a bottom surface of an opening having a high aspect ratio. Thus, step coverage of the tungsten thin film may be deteriorated. However, in example embodiments, as a plurality of the gas filling tanks is charged with the reducing gas, and then, the reducing gas charged within the gas filling tanks may be introduced at the same time (or in multi stages) into the process chamber 10, a large amount of the reducing gas having a relatively high pressure may be supplied sufficiently to the bottom surface of the opening to thereby prevent the gas from decomposing prematurely. Thus, step coverage characteristics of the tungsten thin film and UPEH (Unit Per Equipment Hour) may be improved.

Then, a second purging process may be performed (S50).

The purge gas supply may supply a second purging gas into the process chamber 10 to remove reaction materials remaining within the process chamber 10.

As illustrated in FIG. 10, the first and second discharge valves 126a, 126b (valve #1, valve #2) may be opened and closed in sequential order such that the purging gas may be supplied in multi stages from the first and second gas filling tanks 150a, 150b to the process chamber 10.

The purging gas from the second gas filling tank 150b may be injected into the process chamber during or at the end of the injection of the purging gas from the first gas filling tank 150a. When the purging gas from the second gas filling tank 150b is injected after the completion of the injection of the purging gas from the first gas filling tank 150a, the first gas filling tank 150a may be filled with the purging gas.

As illustrated in FIG. 11, the first and second discharge valves 126a, 126b (valve #1, valve #2) may be opened and closed at the same time such that the purging gas may be supplied together from the first and second gas filling tanks 150a, 150b to the process chamber 10. A pressure of the purging gas supplied through the purge gas supply line 127 may be greater than a charge pressure $P_0$ within one gas filling tank.

In example embodiments, when the purging gas is injected into the process chamber 10, the carrier gas from the carrier gas supply source may be injected into the process chamber.

Then, the steps of S20 to S50 may be repeated with a plurality of cycles, to form a metal layer having a desired thickness.

In FIGS. 1 to 11, the source gas, the reaction gas and/or the purging gas may be supplied to the process chamber using a gas supply having a plurality of gas filling tanks, however, it may not be limited thereto. For example, as described below, it may be understood that a reducing gas for forming a tungsten nucleation layer may be supplied to the process chamber using the gas supply having the gas filling tank configuration.

Hereinafter, a method of manufacturing a semiconductor device using the layer deposition method may be explained.

FIGS. 12 to 16 are cross-sectional views illustrating a method of manufacturing a semiconductor device in accordance with example embodiments. For example, FIGS. 12 to 16 illustrate a method of forming a conductive structure of the semiconductor device using the layer deposition method in accordance with example embodiments.

Figure 12:
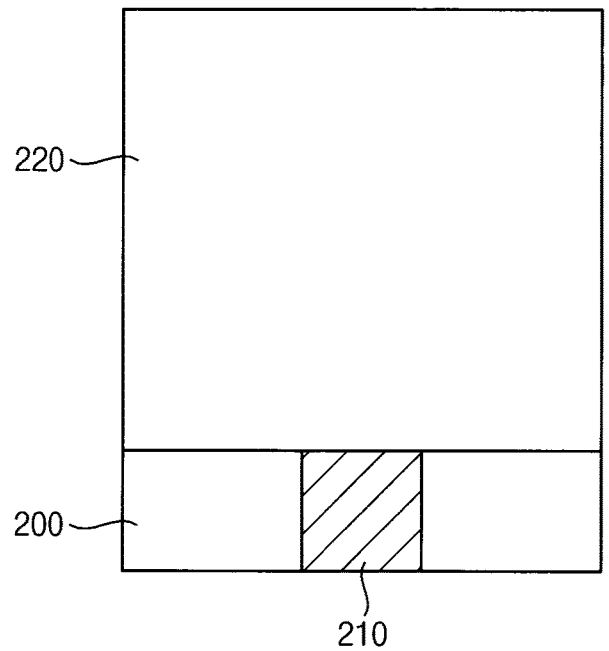

Referring to FIG. 12 an interlayer insulation layer 220 may be formed on a lower structure 200 including a conductive pattern 210 formed therein.

In some embodiments, the lower structure 200 may include a lower insulation layer formed on the substrate W illustrated in FIG. 2. A circuit element including a word line, a gate structure, a diode, a source/drain layer, a contact, a wiring or the like may be formed on the substrate W.

The lower structure 200 may be formed on the substrate W to cover the circuit element. The conductive pattern 210 may be formed in the lower structure 200. The conductive pattern 210 may function as a plug to be electrically connected to at least a portion of the circuit element.

For example, the lower structure 200 may be formed through a CVD process to include a silicon-oxide-based material. The conductive pattern 210 may be formed of or include a metal such as tungsten (W), copper (Cu), titanium (Ti), tantalum (Ta) or the like, metal nitride, metal silicide and or polysilicon doped with impurities.

In some embodiments, the lower structure 200 may include a semiconductor substrate. For example, the lower structure 200 may include silicon, germanium, silicon-germanium or a III-V group compound such as GaP, GaAs, GaSb or the like. In an exemplary embodiment, the lower structure 200 may include a silicon-on-insulator (SOI) substrate or a germanium-on-insulator (GOI) substrate. The conductive pattern 210 may be an impurity region of n-type or p-type, which is formed in the lower structure 200.

The interlayer insulation layer 220 may include the silicon-oxide-based material or a low dielectric organic oxide. For example, the interlayer insulation layer 220 may be formed through a CVD process or a spin coating process.

Figure 13:
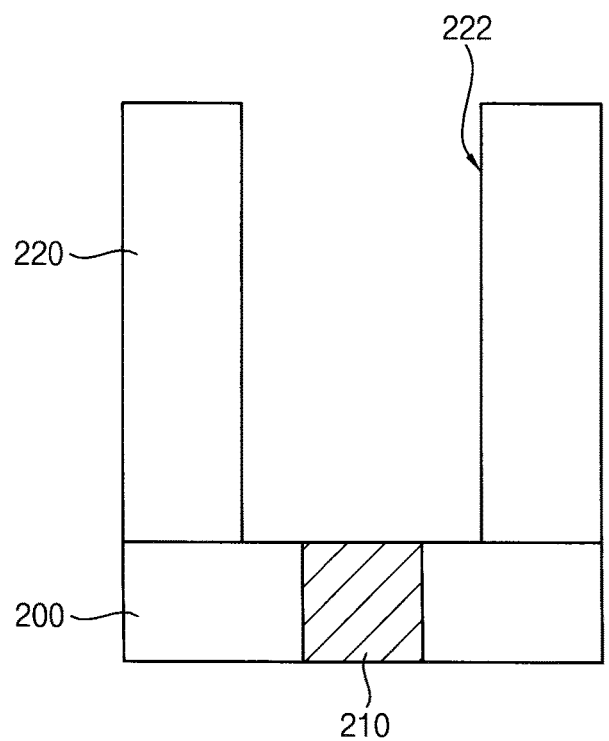

Referring to FIG. 13, the interlayer insulation layer 220 may be partially removed to form an opening 225 partially exposing at least a portion of the conductive pattern 210.

In some embodiments, the opening 225 may have a shape of a hole entirely exposing an upper surface of the conductive pattern 210. In some embodiments, the opening 225 having a shape of a trench exposing the upper surface of the conductive pattern 210 and linearly extending.

Figure 14:
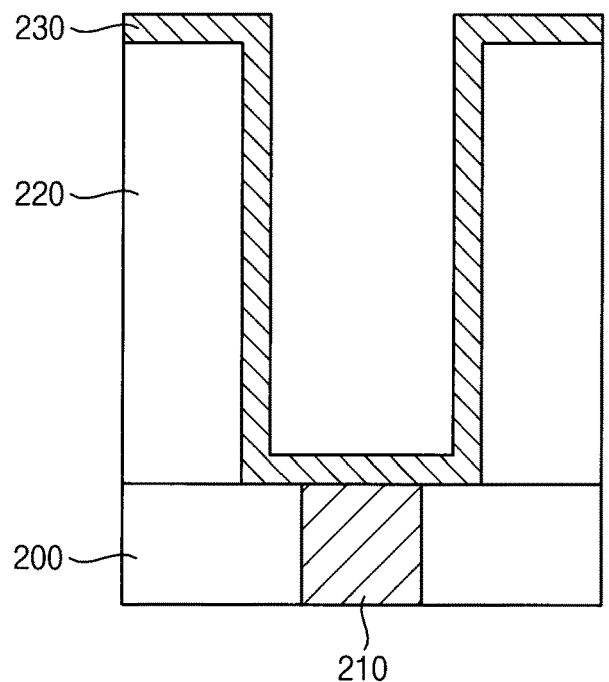

Referring to FIG. 14, a barrier conductive layer 230 may be formed along a surface of the interlayer insulation layer 220 and a sidewall and a bottom surface of the opening 225.

In example embodiments, the barrier conductive layer 230 may be formed by an ALD process or a plasma enhanced ALD (PEALD) process using a metallic precursor. For example, the barrier conductive layer 230 may be formed to include tungsten nitride, tungsten carbide or tungsten carbonitride.

Figure 15:
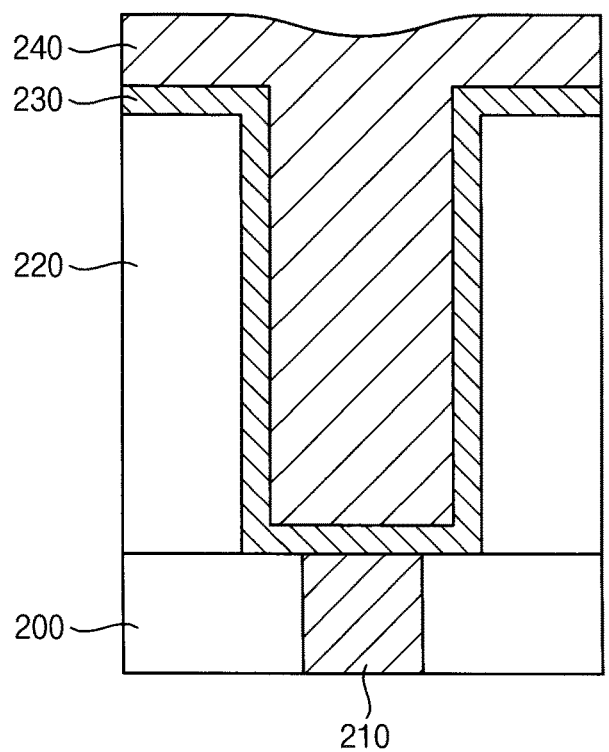

Referring to FIG. 15, a metal layer 240 may be formed on the barrier conductive layer 230 to sufficiently fill the opening 225.

In example embodiments, the metal layer 240 may be formed using the layer deposition method described with reference to FIGS. 9 and 11.

As illustrated in FIGS. 9 to 11, a deposition cycle of a source gas supply process, a first purging process, a reaction gas supply process, and a second purging process may be performed repeatedly to form a metal layer having a desired thickness. For example, $WF_6$ may be used as a source gas and $B_2H_6$ may be used as a reaction gas to form a tungsten thin film.

In this case, the barrier conductive layer 230 and the metal layer 240 may be deposited with in-situ in a substantially same vapor deposition chamber.

Figure 16:
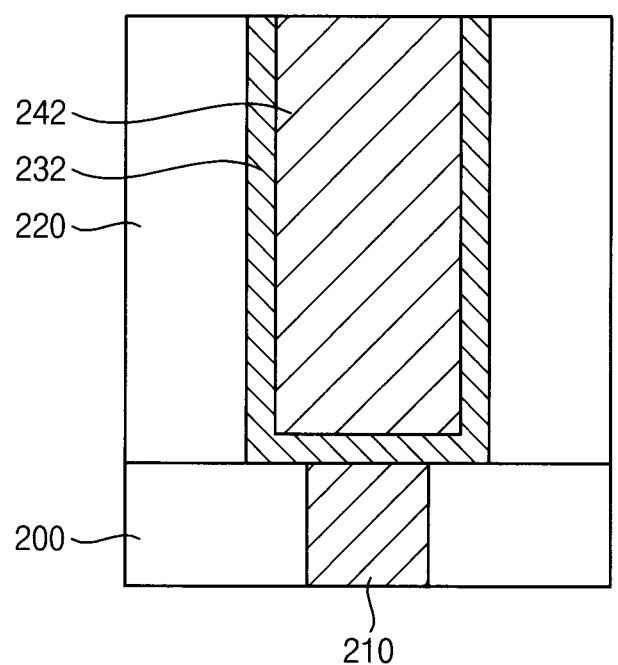

Referring to FIG. 16, an upper portion of the metal layer 240 and the barrier conductive layer 230 may be planarized, for example, by a chemical mechanical polishing (CMP) process until an upper surface of the interlayer insulation layer 220 is exposed.

A conductive structure electrically connected to the conductive pattern 210 and including a barrier conductive pattern 235 and a metal filling pattern 242 may be formed in the opening 225 through the above planarization process. In an embodiment, the conductive structure may include a stacked structure of tungsten nitride/tungsten (WNx/W).

In example embodiments, after forming the barrier conductive layer 230, a pre-treatment process may be performed. The pre-treatment process may be performed using the reaction gas supply process of the layer deposition method as described with reference to FIG. 9.

For example, $B_2H_6$ may be supplied as a reaction gas onto the substrate W having the barrier conductive layer 230 formed thereon. The reaction gas may be supplied using a reaction gas supply having a multi gas filling tank or a pressurized gas filling tank configuration to form a nucleation layer. The $B_2H_6$ reaction gas may be decomposed into boron or boron hydride and then absorbed on the substrate surface, resulting in rapid nucleation rate of the tungsten thin film.

FIGS. 17 to 23 are cross-sectional views illustrating a method of manufacturing a semiconductor device in accordance with example embodiments. For example, FIGS. 17 to 23 may illustrate a method of manufacturing a non-volatile semiconductor device having a 3-dimensional structure or a vertical type memory device including a vertical channel.

In FIGS. 17 to 23, a direction vertically extending from an upper surface of a substrate may be defined as a first direction. Furthermore, two directions that are parallel with the upper surface of the substrate and form a cross with each other may be defined as a second direction and a third direction, respectively. For example, the second direction and third direction may cross each other perpendicularly.

Figure 17:
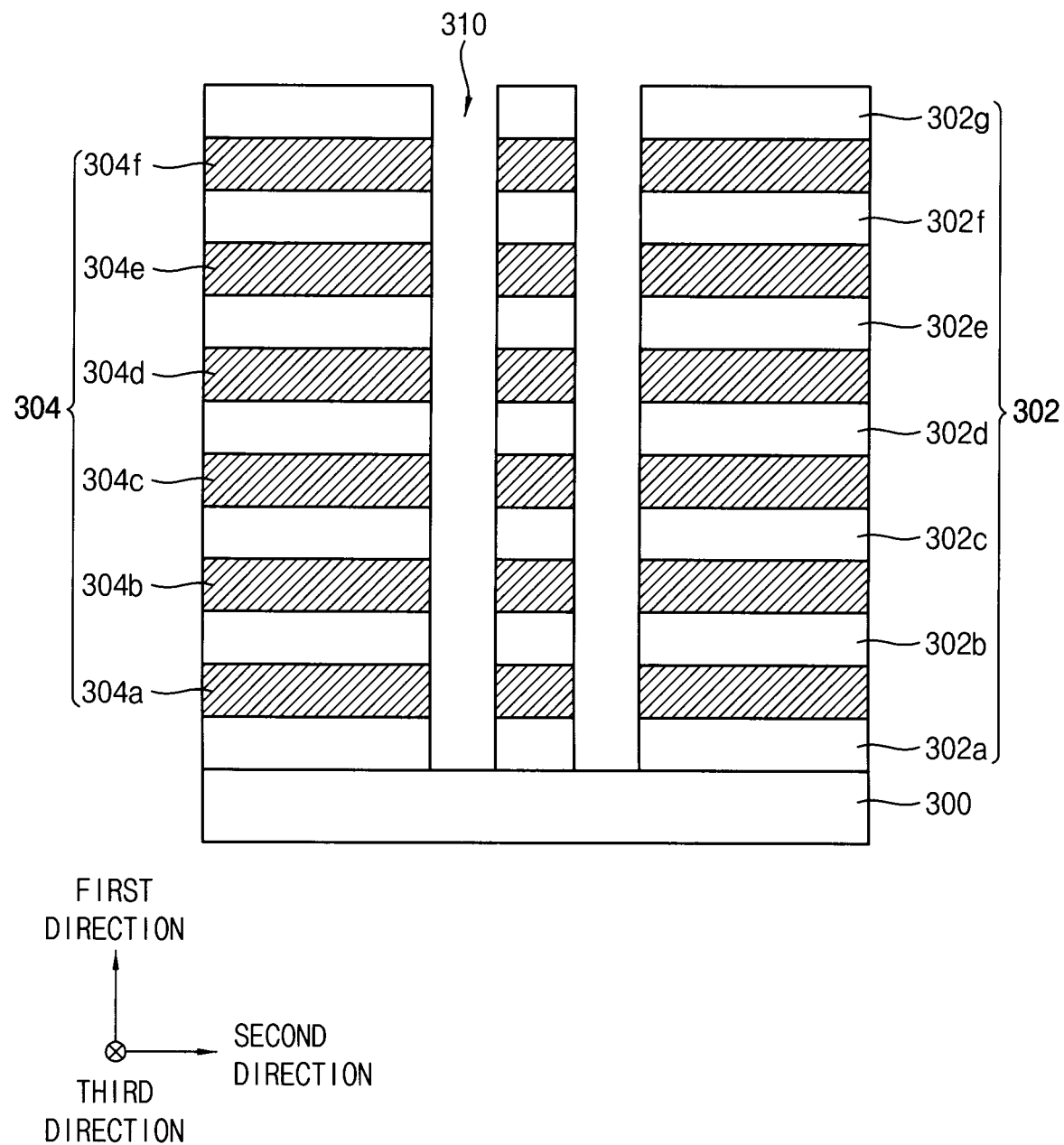

Referring to FIG. 17, interlayer insulation layers 302 (e.g., 302a through 302g) and sacrificial layers 304 (e.g., 304a through 304f) may be alternately and repeatedly formed on a substrate 300 to form a mold structure. Thereafter, the mold structure may be partially etched to form channel holes 310 exposing an upper surface of the substrate 300.

For example, the interlayer insulation layers 302 may include silicon oxide. The sacrificial layers 304 may include a material that may have an etching selectivity with respect to the interlayer insulation layers 302 and may be relatively easily removed through a wet etching process. For example, the sacrificial layer 304 may include silicon nitride.

The sacrificial layers 304 may be removed in a subsequent process to provide spaces for a ground selection line (GSL), a word line and a string selection line (SSL). Thus, the total number of interlayer insulation layers 302 and sacrificial layers 304 may be determined in consideration of the total number of GSL, the word line and the SSL.

For example, each of the GSL and the SSL may be formed at a single level, and the word lines may be formed at 4 respective levels. As used herein, "level" may refer to a height or elevation with respect to a substrate (e.g., substrate 300). In this case, the sacrificial layers 304 and the interlayer insulation layers 302 are formed at 6 respective levels and 7 respective levels, respectively. However, the total number of the interlayer insulation layers 302 and the sacrificial layers 304 are not specifically limited thereto in example embodiments, and the total number of the interlayer insulation layers 302 and the sacrificial layers 304 may increase or decrease depending on a degree of integration of the semiconductor device.

For example, the mold structure may be partially removed through a dry etching process to form a plurality of channel holes 310. The channel holes 310 may form a channel hole row along the third direction. Additionally, the channel holes 310 may form a channel hole row along the second direction.

Figure 18:
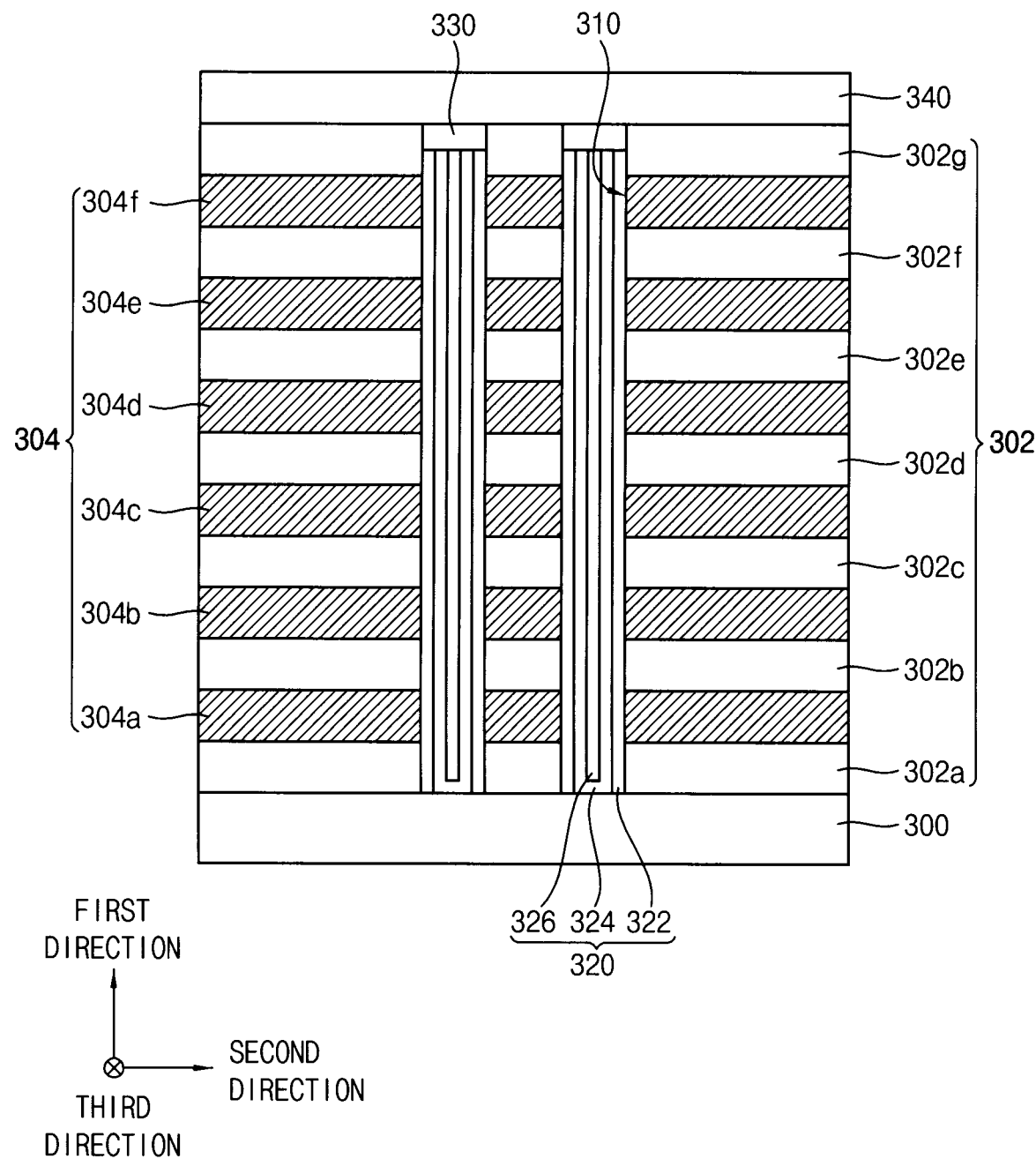

Referring to FIG. 18, a vertical channel structure 320 including a dielectric layer structure 322, a channel 324 and a filling pattern 326 may be formed in each of the channel holes 310. A capping pad 330 may be formed on the vertical channel structure 320.

For example, a dielectric layer may be formed along a sidewall and a bottom surface of the channel holes 310 and an upper surface of the uppermost interlayer insulation layer 302g. For example, a blocking layer, a charge trap layer and a tunnel insulation layer may be sequentially formed to obtain the dielectric layer.

For example, the blocking layer may be formed by using an oxide, such as silicon oxide, the charge trap layer may be formed by using silicon nitride or a metal oxide, and the tunnel insulation layer may be formed by using an oxide such as silicon oxide. For example, the dielectric layer may be formed to have an ONO-layered structure.

For example, upper and lower portions of the dielectric layer may be removed through an etch-back process. Thus, portions of the dielectric layer formed on the upper surfaces of the uppermost interlayer insulation layer 302g and the substrate 300 may be substantially removed to form the dielectric layer structure 322. For example, the dielectric layer structure 322 may be formed at the sidewall of the channel hole 310, and may have a substantially straw shape or a substantially cylindrical shell shape.

Thereafter, a channel layer may be formed on surfaces of the uppermost interlayer insulation layer 302g and the dielectric layer structures 322, and the upper surface of the substrate 300. A filling layer may be formed on the channel layer to fill remaining portions of the channel holes 310.

In example embodiments, the channel layer may be formed by using polysilicon or amorphous silicon optionally doped with impurities. In an embodiment, a heat treatment or a laser beam irradiation may be further performed on the channel layer to change polysilicon or amorphous silicon of the channel layer into single crystalline silicon. The filling layer may be formed by using an insulation material such as silicon oxide or silicon nitride.

The filling layer and the channel layer may be planarized, for example, through a CMP process and/or an etch-back process until the uppermost interlayer insulation layer 302g is exposed. Accordingly, a channel 324 and a filling pattern 326 sequentially stacked from an inner wall of the dielectric layer structure 322 may be formed to fill the channel hole 310.

The channel 324 may have a substantially cup shape, and may be in contact with the upper surface of the substrate 300 exposed through the channel hole 310. The filling pattern 326 may have a substantially pillar shape or a solid cylindrical shape.

The channel 324 may be formed in each channel hole 310, and thus a channel row comparable to the channel hole row may be formed.

A capping pad 330 capping an upper portion of the channel hole 310 may be further formed on the vertical channel structure 320. For example, upper portions of the dielectric layer structure 322, the channel 324 and the filling pattern 326 may be partially removed through an etch-back process to form a recess. A pad layer may be formed on the uppermost interlayer insulation layer 302g to fill the recess. An upper portion of the pad layer may be planarized, for example, through a CMP process, until the upper surface of the uppermost interlayer insulation layer 302g is exposed, to form the capping pad 330. In an exemplary embodiment, the pad layer may be formed by using polysilicon optionally doped with n-type impurities.

A first upper insulation layer 340 may be formed on the uppermost interlayer insulation layer 302g to cover the capping pads 330. For example, the first upper insulation layer 340 may be formed through a CVD process, a spin coating process or the like, and may include silicon oxide.

Figure 19:
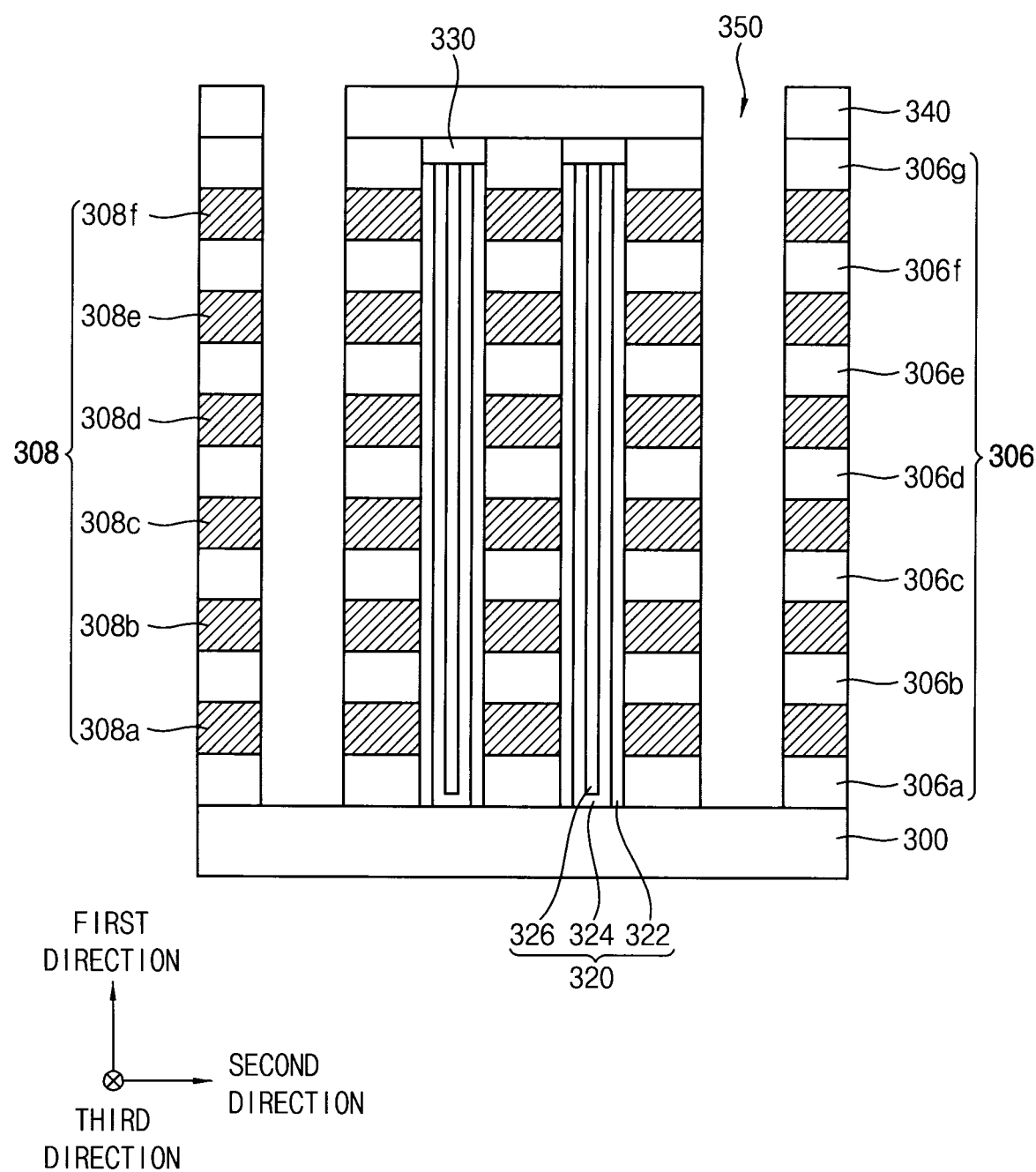

Referring to FIG. 19, the first upper insulation layer 340 and the mold structure may be partially etched to form an opening 350. For example, portions of the first upper insulation layer 340 and the mold structure between channel rows adjacent to each other may be etched through a dry etching process to form the opening 350.

The opening 350 may pass through the mold structure along the first direction to expose the upper surface of the substrate 300. Furthermore, the opening 350 may extend along the third direction, and a plurality of openings 350 may be formed and arranged along the second direction.

The opening 350 may be provided as a gate line cut region. The predetermined number of the channel rows may be arranged between the openings 350 adjacent to each other along the second direction.

As the openings 350 are formed, the interlayer insulation layers 302 and the sacrificial layers 304 may be changed into interlayer insulation layer patterns 306 (e.g., 306a through 306g) and sacrificial patterns 308 (e.g., 308a through 308f). The interlayer insulation layer patterns 306 and the sacrificial patterns 308 at each level may have a plate shape surrounding the vertical channel structures 320 included in the channel rows and extending in a direction.

Figure 20:
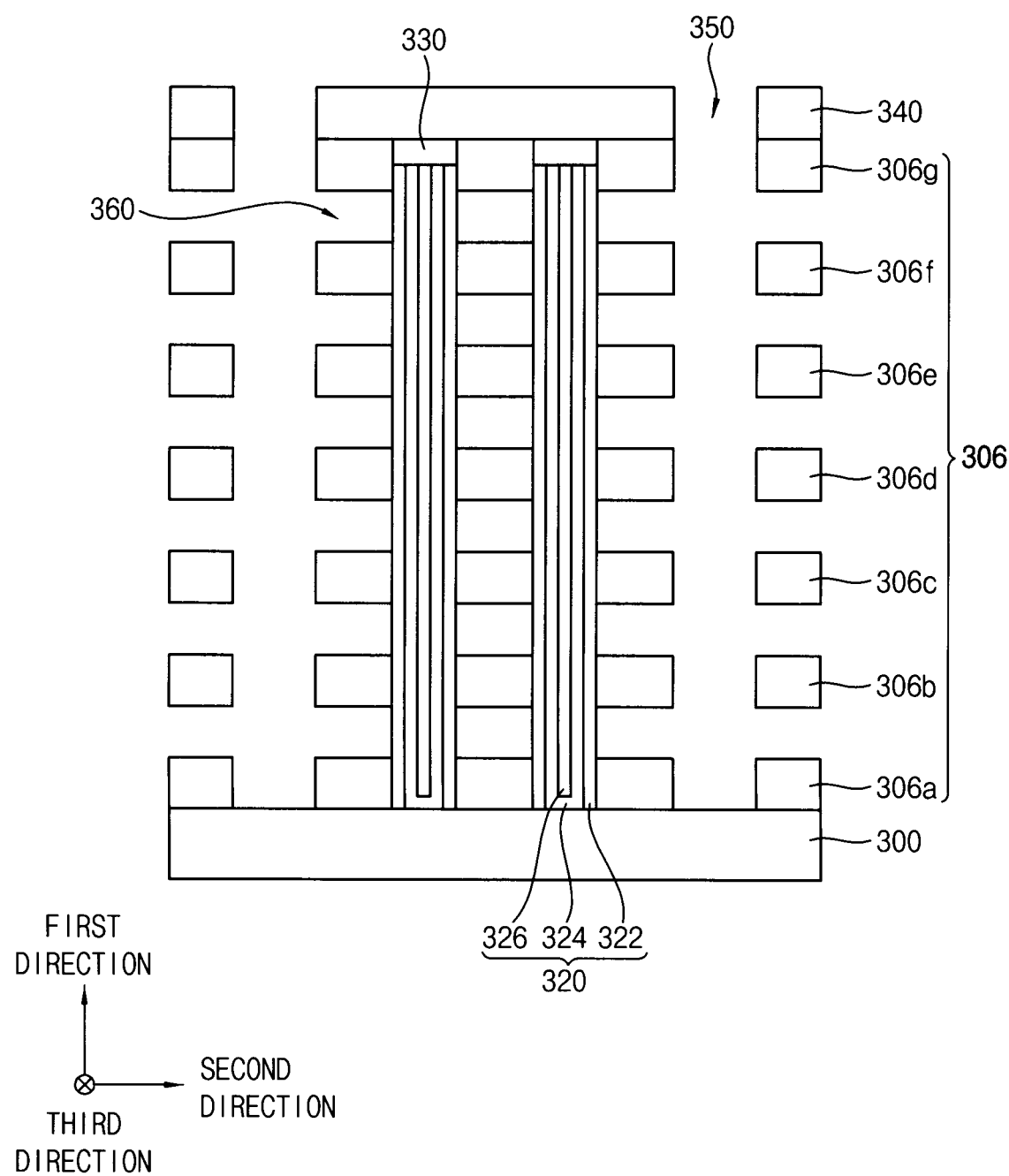

Referring to FIG. 20, the sacrificial patterns 308, of which the sidewalls are exposed by the opening 350, may be removed.

When the sacrificial patterns 308 include silicon nitride, and when the interlayer insulation layer patterns 306 include silicon oxide, the sacrificial patterns 308 may be removed through a wet etching process using an etchant solution having selectivity with respect to silicon nitride, for example, phosphoric acid.

A gap 360 may be defined by a space from which the sacrificial patterns 308 are removed. A plurality of the gaps 360 may be formed between the adjacent interlayer insulation layer patterns 306. An outer sidewall of the dielectric layer structure 322 may be exposed by the gaps 360.

Figure 21:
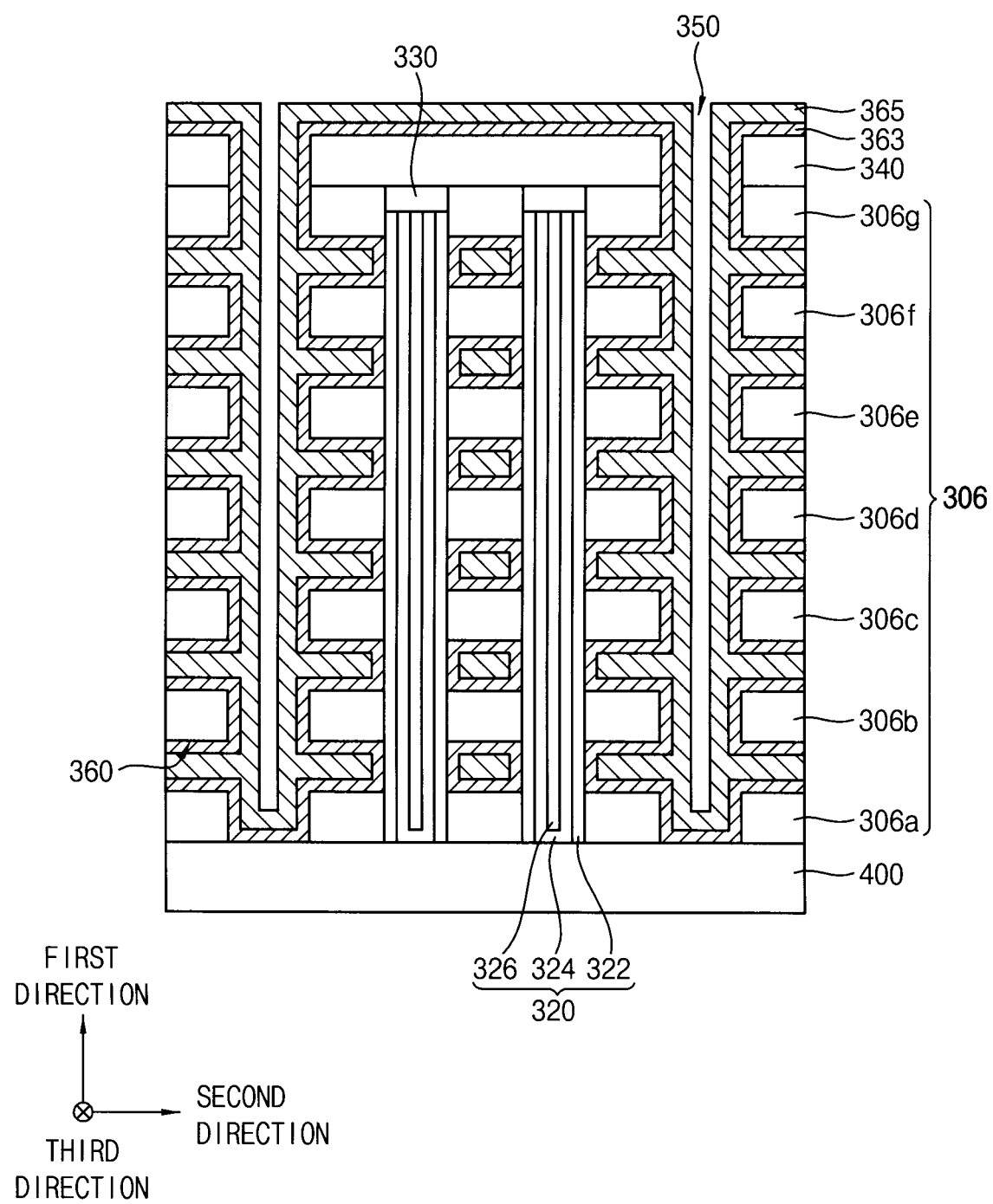

Referring to FIG. 21, a barrier conductive layer 363 may be formed along the exposed outer sidewall of the dielectric layer structure 322, an inner wall of the gap 360, a surface of the interlayer insulation layer pattern 306, and the exposed upper surface of the substrate 300. A metal gate layer 365 may be formed on the barrier conductive layer 363. In an exemplary embodiment, the metal gate layer 365 may sufficiently fill the gap 360, and may at least partially fill the opening 350.

For example, the barrier conductive layer 363 may be formed by an ALD process or a plasma enhanced ALD (PEALD) process using a metallic precursor. For example, the barrier conductive layer 363 may be formed to include tungsten nitride, tungsten carbide or tungsten carbonitride.

In example embodiments, a reaction gas such as $B_2H_6$ may be supplied onto the substrate W having the barrier conductive layer 363 formed thereon, to form a nucleation layer. The reaction gas may be supplied using a reaction gas supply having a multi gas filling tank or pressurized gas filling tank configuration as described with reference to FIGS. 1 to 11. The $B_2H_6$ reaction gas may be decomposed into boron or boron hydride and then absorbed on the substrate surface, resulting in a rapid nucleation rate of a tungsten thin film.

The opening 350 may have a high aspect ratio according to the degree of integration of the semiconductor device. The reducing gas such as $B_2H_6$ may be decomposed before the reducing gas reaches a bottom surface of the opening 350 having a high aspect ratio. Thus, step coverage of the tungsten thin film may be deteriorated. However, in example embodiments, as the reducing gas has a pressure greater than the discharge pressure $P_0$, a large amount of the reaction gas may be supplied sufficiently into the gap 360 adjacent to the bottom surface of the opening 350.

Then, the metal gate layer 365 may be formed on the barrier conductive layer 363 by using the layer deposition method described with reference to FIGS. 9 to 11.

As illustrated in FIGS. 9 to 11, a deposition cycle of a source gas supply process, a first purging process, a reaction gas supply process, and a second purging process may be performed repeatedly to form a metal layer having a desired thickness. For example, $WF_6$ may be used as a source gas and $B_2H_6$ may be used as a reaction gas to form a tungsten thin film.

Figure 22:
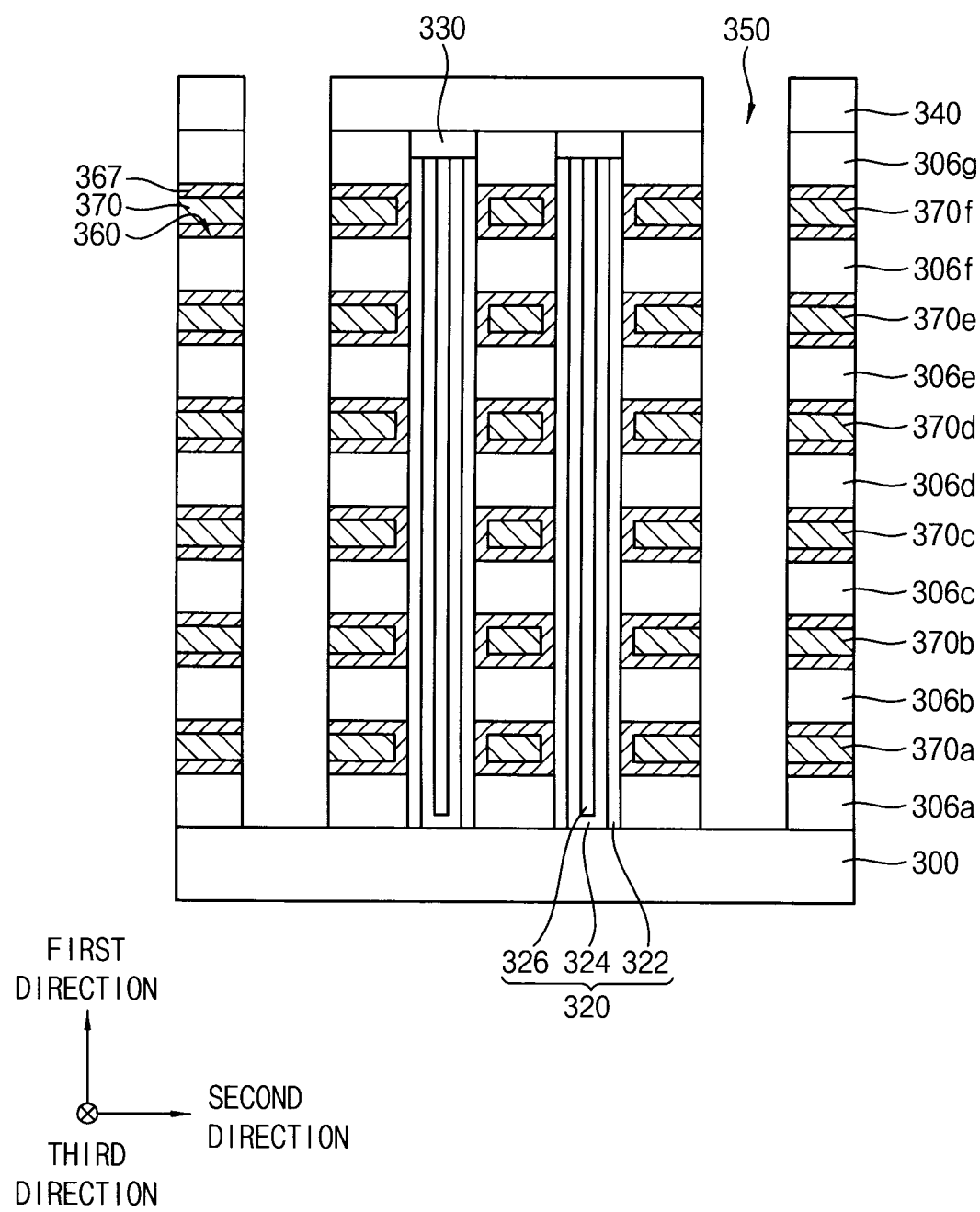

Referring to FIG. 22, the barrier conductive layer 363 and the metal gate layer 365 may be partially etched to form a barrier conductive pattern 367 and a metal gate 370 (e.g., 370a through 370f) in each of the gaps 360. The metal gate 370 may have a linear shape or a plate shape, which surrounds sidewalls of the vertical channel structures 320 included in the channel rows and extending in direction.

For example, upper portions of the barrier conductive layer 363 and the metal gate layer 365 may be planarized through a CMP process until an upper surface of the first upper insulation layer 340 may be exposed. Thereafter, portions of the barrier conductive layer 363 and the metal gate layer 365 formed in the opening 350 may be etched through an anisotropic etching process to form the barrier conductive pattern 367 and the metal gate 370 in the gap 360 at each of the levels. The barrier conductive pattern 367 may be formed along the inner wall of the gap 360, and the metal gate 370 may be formed on the barrier conductive pattern 367 to fill the gap 360 at each of the levels.

The metal gates 370 may include a GSL, a word line and a SSL sequentially stacked from the upper surface of the substrate 300 and spaced apart from one another along the first direction. For example, a lowermost metal gate 370a may be provided as the GSL. The four metal gates 370b to 370e on the GSL may be provided as the word line. An uppermost metal gate 370f on the word line may be provided as the SSL.

Figure 23:
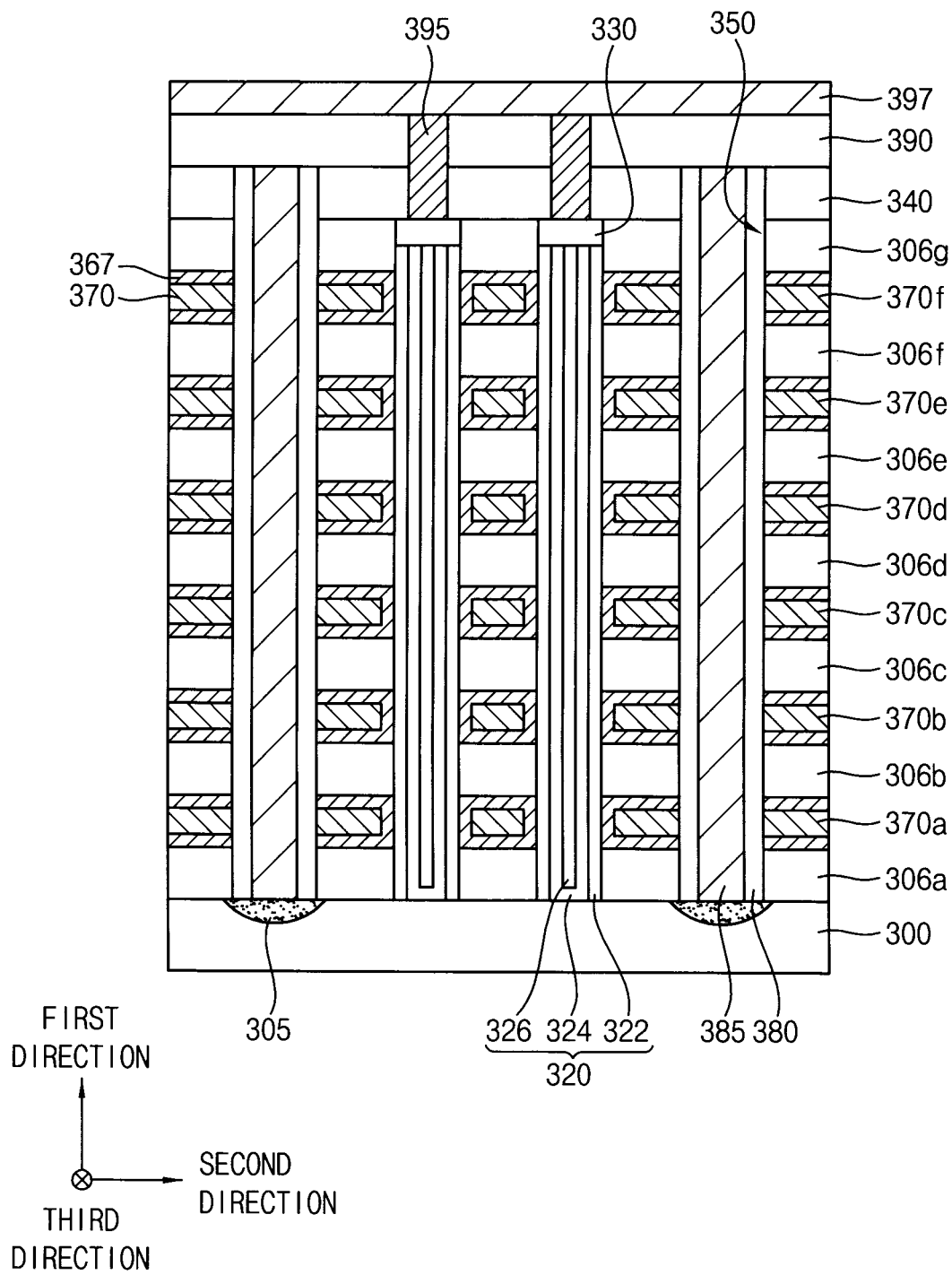

Referring to FIG. 23, an impurity region 305 may be formed on the substrate 300 exposed by the opening 350, and a spacer 380 and a cutting pattern 385 may be formed in the opening 350.

For example, n-typed impurities such as phosphor or arsenic may be provided through the opening 350, for example, by an ion implantation process to form the impurity region 305. The impurity region 305 may be formed on the substrate 300 and may extend along the third direction.

The spacer 380 may be formed at the sidewall of the opening 350. For example, a spacer layer including an insulation material such as silicon oxide may be formed along the upper surface of the first upper insulation layer 340 and the sidewall and the bottom surface of the opening 350 through an ALD process. For example, the spacer layer may be partially removed through an anisotropic etching process or an etch-back process to selectively form the spacer 380 at the sidewall of the opening 350.

Thereafter, the cutting pattern 385 may be formed to fill a remaining portion of the opening 350. For example, a conductive layer may be formed on the first upper insulation layer 340 to sufficiently fill the opening 350. An upper portion of the conductive layer may be planarized through a CMP process, until the upper surface of the first upper insulation layer 340 is exposed, to form the cutting pattern 385 extending in the opening 350.

The conductive layer may be formed of or include a metal, a metal nitride, a metal silicide and/or polysilicon doped with impurities, and may be formed through an ALD process or a sputtering process. The cutting pattern 385 may be provided as a CSL of the semiconductor device.

In some embodiments, the conductive layer may be formed by using a metallic precursor according to example embodiments. In this case, the cutting pattern 385 may include tungsten.

A second upper insulation layer 390 may be formed on the first upper insulation layer 340 to cover the cutting pattern 385 and the spacer 380. The second upper insulation layer 390 may include silicon oxide substantially similar to or the same as the first upper insulation layer 340, and may be formed through a CVD process.

Thereafter, a bit line contact 395 may be formed. The bit line contact 395 may pass through the first and second upper insulation layers 340 and 390 to contact the capping pad 330. Thereafter, a bit line 397 electrically connected to the bit line contact 395 may be formed on the second upper insulation layer 390. The bit line contact 395 and the bit line 397 may include a metal, a metal nitride, polysilicon doped with impurities or the like, and may be formed through a CVD process, an ALD process, a sputtering process or the like.

A plurality of the bit line contacts 395 may be formed to correspond to the capping pad 330 thereby forming a bit line contact array. Furthermore, the bit line 397 may extend along the second direction, and may be electrically connected to a plurality of the capping pads 330 through the bit line contact 395. Furthermore, a plurality of the bit lines 397 may be formed along the third direction.

The layer deposition apparatus and the layer deposition method according to example embodiments may be used for forming a conductive structure such as a gate pattern of a flash memory device or the like. Furthermore, the layer deposition apparatus and the layer deposition method may be used for forming an electrode, a gate, a contact or the like for various semiconductor devices such as an MRAM device, an ReRAM device, a PRAM device, a login element or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A gas supply for a layer deposition apparatus, comprising:
   a plurality of charge distribution lines respectively connected to a plurality of first gas supply sources;
   a plurality of gas filling tanks respectively connected to the charge distribution lines, each of the gas filling tanks being pressurized with a first gas from the first gas supply source;
   a gas supply line connected to a second gas supply source; and
   a multi-dosing valve assembly connected to outlet portions of the gas filling tanks and configured to supply, sequentially, the first gas from the gas filling tanks to a process chamber,
   wherein the multi-dosing valve assembly comprises:
   a flow path block having a main supply line connected to the process chamber;
   a plurality of valve blocks fastened to the flow path block, each valve block having a corresponding discharge valve, wherein each respective discharge valve is operable to control discharging of the first gas out of the respective gas filling tank to the main supply line; and
   a backflow prevention valve block having an opening/closing valve therein, the backflow prevention valve block fastened to the flow path block and connected to one end of the main supply line and one end of the gas supply line, wherein the opening/closing valve is operable to control the flow of a second gas from the gas supply line to the main supply line.

2. The gas supply for the layer deposition apparatus of claim 1, wherein the discharge valves are respectively connected to a corresponding gas filling tank and the discharge valves are connected to the main supply line, and
   wherein the opening/closing valve is connected in series to an upstream-side end portion of the main supply line.

3. The gas supply for the layer deposition apparatus of claim 1, wherein a first purge flow passage and a second purge flow passage are formed in the flow path block, the first purge flow passage constitutes at least a portion of an upstream-side end portion of the main supply line, and the second purge flow passage is connected to the gas supply line, and wherein the opening/closing valve is installed between the first purge flow passage and the second purge flow passage.

4. The gas supply for the layer deposition apparatus of claim 3, wherein a plurality of supply flow passages is formed in the flow path block, two outlet passages are formed in the respective valve block and connected to an outlet port of the respective discharge valve, and the outlet passages are connected to the supply flow passages and the first purge flow passage.

5. The gas supply for the layer deposition apparatus of claim 1, further comprising:
a plurality of flow controllers, each flow controller respectively installed in a corresponding charge distribution line.

6. The gas supply for the layer deposition apparatus of claim 1, wherein the gas filling tanks are installed along a first side portion of an upper surface of the flow path block, and the valve blocks are fastened along a second side portion of the upper surface of the flow path block opposite to the first side portion.

7. The gas supply for the layer deposition apparatus of claim 6, wherein the backflow prevention valve block is fastened to the second side portion of the upper surface of the flow path block adjacent to the valve blocks.

8. The gas supply for the layer deposition apparatus of claim 1, wherein the first gas includes at least one of: a source gas, a reaction gas, and a purging gas, and wherein the second gas includes a carrier gas.

9. The gas supply for the layer deposition apparatus of claim 8, wherein the purging gas and the carrier gas include a gas of the same type.

10. The gas supply for the layer deposition apparatus of claim 8, wherein the source gas includes a tungsten precursor and the reaction gas includes boron.

11. A layer deposition apparatus, comprising:
a process chamber configured to house a substrate and provide a space for performing a deposition process on the substrate;
at least one first gas supply source;
a second gas supply source;
a gas supply including a plurality of gas filling tanks pressurized with a first gas from the first gas supply source, and a multi-dosing valve assembly connected to outlet portions of the gas filling tanks and configured to supply, sequentially, the first gas from the gas filling tanks to the process chamber; and
a controller configured to control an operation of the gas supply,
wherein the multi-dosing valve assembly comprises:
a flow path block having a main supply line connected to the process chamber;
a plurality of valve blocks fastened to the flow path block, each valve block having a corresponding discharge valve, wherein each respective discharge valve is operable to control discharging of the first gas out of the respective gas filling tank to the main supply line; and
a backflow prevention valve block having an opening/closing valve therein, the backflow prevention valve block fastened to the flow path block and connected to one end of the main supply line and one end of the gas supply line, wherein the opening/closing valve is operable to control the flow of a second gas from the second gas supply source to the main supply line.

12. The layer deposition apparatus of claim 11, wherein the discharge valves are respectively connected to a corresponding gas filling tank and the discharge valves are connected to the main supply line, and
wherein the opening/closing valve is connected in series to an upstream-side end portion of the main supply line.

13. The layer deposition apparatus of claim 12, wherein a first purge flow passage and a second purge flow passage are formed in the flow path block, the first purge flow passage constitutes at least a portion of the upstream-side end portion of the main supply line, and the second purge flow passage is connected to the second gas supply source, and
wherein the opening/closing valve is installed between the first purge flow passage and the second purge flow passage.

14. The layer deposition apparatus of claim 13, further comprising flow controllers, each flow controller respectively installed in a corresponding charge distribution line of a plurality of charge distribution lines which are respectively connected to a plurality of first gas supply sources, and wherein the gas filling tanks are connected to the charge distribution lines, respectively.

15. The layer deposition apparatus of claim 11, wherein the first gas includes at least one of: a source gas, a reaction gas, and a purging gas, and wherein the second gas includes a carrier gas.

16. A layer deposition apparatus, comprising:
a process chamber configured to house a substrate and providing a space for performing a deposition process on the substrate;
a source gas supply configured to supply a source gas from at least one source gas supply source to the process chamber;
a reaction gas supply configured to supply a reaction gas from at least one reaction gas supply source to the process chamber; and
a purge gas supply configured to supply a purging gas from at least one purge gas supply source to the process chamber,
wherein at least one of: the source gas supply, the reaction gas supply and the purge gas supply comprises,
a plurality of charge distribution lines connected to the source gas supply source, the reaction gas supply source, or the purge gas supply source;
a plurality of gas filling tanks respectively connected to the charge distribution lines, each of the gas filling tanks being pressurized with at least one gas chosen from: the source gas, the reaction gas, and the purge gas;
a plurality of discharge valves connected in sequence to a main supply line which is connected to the process chamber, wherein each respective discharge valve is operable to control discharging of a corresponding gas out of the respective gas filling tank to the main supply line;
a gas supply line connected to a carrier gas supply source;
an opening/closing valve connected to one end of the main supply line and one end of the gas supply line, the opening/closing valve being operable to control the flow of a carrier gas from the gas supply line to the main supply line; and
a plurality of flow controllers, each flow controller respectively installed in a corresponding charge distribution line.

17. The layer deposition apparatus of claim 16, wherein the at least one of the source gas supply, the reaction gas supply, and the purge gas supply further comprises,
a gas supply line connected to a carrier gas supply source; and an opening/closing valve operable to control the flow of a carrier gas from the gas supply line to the main supply line.

18. The layer deposition apparatus of claim 17, wherein the discharge valves are connected to the main supply line, and the opening/closing valve is connected in series to an upstream-side end portion of the main supply line.

19. The layer deposition apparatus of claim 16, wherein the source gas includes a tungsten precursor and the reaction gas includes boron.

20. The layer deposition apparatus of claim 16, wherein the reaction gas includes B2H6 of at least 10 wt % based on a total weight.

* * * * *